US008754677B2

(12) United States Patent
Chen et al.

(10) Patent No.: US 8,754,677 B2
(45) Date of Patent: Jun. 17, 2014

(54) SYSTEM AND METHOD OF IMPLEMENTING INPUT/OUTPUT DRIVERS WITH LOW VOLTAGE DEVICES

(71) Applicant: QUALCOMM Incorporated, San Diego, CA (US)

(72) Inventors: Wilson Jianbo Chen, San Diego, CA (US); Chiew-Guan Tan, San Diego, CA (US); Reza Jalilizeinali, Oceanside, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/683,053

(22) Filed: Nov. 21, 2012

(65) Prior Publication Data

US 2014/0091860 A1 Apr. 3, 2014

Related U.S. Application Data

(60) Provisional application No. 61/708,563, filed on Oct. 1, 2012.

(51) Int. Cl.
*H03K 3/00* (2006.01)

(52) U.S. Cl.
USPC .............................................. 327/112; 326/83

(58) Field of Classification Search
USPC ............... 327/108–112, 427, 434; 326/82, 83
See application file for complete search history.

(56) References Cited

U.S. PATENT DOCUMENTS

| | | | | |
|---|---|---|---|---|
| 5,825,640 | A * | 10/1998 | Quigley et al. | 363/60 |
| 6,316,977 | B1 * | 11/2001 | Sargeant | 327/157 |
| 7,471,102 | B2 * | 12/2008 | Maheshwari et al. | 324/762.09 |
| 7,511,531 | B2 | 3/2009 | Pan et al. | |
| 7,915,933 | B2 * | 3/2011 | Vlasenko et al. | 327/157 |
| 8,159,261 | B2 | 4/2012 | Kim et al. | |
| 8,159,262 | B1 | 4/2012 | Bhattacharya et al. | |
| 2002/0089382 | A1 * | 7/2002 | Yang | 331/17 |
| 2010/0226189 | A1 | 9/2010 | Choi | |
| 2012/0169381 | A1 | 7/2012 | Mei | |
| 2012/0326768 | A1 * | 12/2012 | Bhattacharya et al. | 327/524 |

* cited by examiner

*Primary Examiner* — Lincoln Donovan
*Assistant Examiner* — Thomas Skibinski
(74) *Attorney, Agent, or Firm* — Paul S. Holdaway

(57) ABSTRACT

An input/output (I/O) driver is disclosed that employs a compensation circuit to limit the voltages across devices of the driver from exceeding a defined threshold to allow lower voltage devices to implement the operation of the driver. In particular, the driver employs a pull-up circuit including first and second switching devices coupled between a first voltage rail and an output of the driver. The driver employs a pull-down circuit including third and fourth switching devices coupled between the output and a second voltage rail. The I/O driver employs a compensation circuit configured to apply a compensation voltage to the node between the first and second switching devices and to the node between the third and fourth switching devices at the appropriate times to maintain the respective voltages across the second and third switching devices at or below a defined threshold, such as a reliability limit, during the operation of the driver.

49 Claims, 8 Drawing Sheets

SYSTEM AND METHOD OF IMPLEMENTING INPUT/OUTPUT DRIVERS WITH LOW VOLTAGE DEVICES

CROSS REFERENCE TO A RELATED APPLICATION

This application claims the benefit of the filing date of Provisional Application Ser. No. 61/708,563, filed on Oct. 1, 2012, and entitled "System and Method of Implementing Input/Output Drivers with Low Voltage Devices," which is incorporated herein by reference.

FIELD

The present disclosure relates generally to integrated circuits, and more specifically, to a system and method of implementing input/output (I/O) drivers using relatively low voltage devices.

BACKGROUND

Integrated circuits of today typically include numerous devices (e.g., millions or even billions of devices) in order to perform their intended operations. One of the most common devices used in integrated circuits is the complementary metal oxide semiconductor field effect transistor (CMOSFET or CMOS, for short). Some CMOS devices are employed to process signals residing internally within integrated circuits. Other CMOS devices are implemented at the periphery of integrated circuits, such as in input/output (I/O) circuits, to receive input data or signaling for the integrated circuits or produce output data or signaling for devices external to the integrated circuits.

Often, I/O drivers are configured to receive or output data or signaling with defined voltage levels. For example, some I/O drivers are required to generate digital data or signaling with defined voltage levels of zero (0) and +3.6V. However, the non-I/O driver devices internal to integrated circuits may not have such voltage level requirements. In many cases, it is desirable to operate the non-I/O driver devices at much lower voltages in order to process the data or signaling at a much faster rate. For example, it may be desirable to operate CMOS devices at defined voltage levels of zero (0) and +1.8V.

However, employing two or more different types of CMOS, such as lower voltage CMOS devices for non-I/O applications and higher voltage CMOS devices for I/O applications, is not generally desirable since it requires more masks and more processing steps to manufacture the integrated circuits. Generally, the higher number of masks and processing steps required to manufacture integrated circuits, the higher the associated costs to manufacture the integrated circuits. Further, simply employing the lower voltage devices for higher voltage I/O applications is also not desirable since such lower voltage devices may be overstressed and their reliability would be decreased, or altogether damaged and performance and functionality would be compromised.

SUMMARY

An aspect of the disclosure relates to an apparatus comprising a pull-up circuit including first and second switching devices coupled in series between a first voltage rail and an output, wherein the first and second switching devices are configured to turn on to cause a voltage at the output to be substantially at a steady-state first rail voltage, and wherein the first and second switching devices are configured to turn off to isolate the output from the first voltage rail when the output voltage is substantially at a steady-state second rail voltage.

The apparatus further comprises a pull-down circuit comprising third and fourth switching devices coupled in series between the output and a second voltage rail, wherein the third and fourth switching devices are configured to turn on to cause the output voltage to be substantially at the steady-state second rail voltage, and wherein the third and fourth switching devices are configured to turn off to isolate the output from the second voltage rail when the output voltage is substantially at the steady-state first rail voltage.

Additionally, the apparatus comprises a compensation circuit configured to: apply a first compensation voltage to a first node between the first and second switching devices to maintain a first voltage across the second switching device at or below a first defined threshold; apply a second compensation voltage to a second node between the third and fourth switching devices to maintain a second voltage across the third switching device at or below a second defined threshold; or apply the first compensation voltage to the first node between the first and second switching devices to maintain the first voltage across the second switching device at or below the first defined threshold, and apply the second compensation voltage to the second node between the third and fourth switching devices to maintain the second voltage across the third switching device at or below the second defined threshold.

In another aspect of the disclosure, the compensation circuit is configured to apply the first compensation voltage to the first node between the first and second switching devices to maintain the first voltage across the second switching device at or below the first defined threshold when the output voltage is substantially at the steady-state second rail voltage. In still another aspect, the compensation circuit is configured to apply the second compensation voltage to the second node between the third and fourth switching devices to maintain the second voltage across the third switching device at or below the second defined threshold when the output voltage is substantially at the steady-state first rail voltage.

In another aspect of the disclosure, the compensation circuit is further configured to apply the first compensation voltage to the first node between the first and second switching devices during at least a portion of a transition of the output voltage from the second rail voltage to the first rail voltage to maintain the first voltage across the second switching device at or below the first defined threshold during the transition of the output voltage from the second rail voltage to the first rail voltage.

In another aspect of the disclosure, the compensation circuit is further configured to apply the second compensation voltage to the second node between the third and fourth switching devices during at least a portion of a transition of the output voltage from the first rail voltage to the second rail voltage to maintain the second voltage across the third switching device at or below the second defined threshold during the transition of the output voltage from the first rail voltage to the second rail voltage.

In another aspect of the disclosure, the compensation circuit is further configured to apply the first compensation voltage to the first node between the first and second switching devices during a first portion of a transition of the output voltage from the second rail voltage to the first rail voltage to maintain the first voltage across the second switching device at or below the first defined threshold during the first portion of the transition of the output voltage from the second rail voltage to the first rail voltage; and discontinue the application of the first compensation voltage to the first node between the first and second switching devices during a second portion of the transition of the output voltage from the second rail voltage to the first rail voltage.

In another aspect of the disclosure, the apparatus comprises a controller configured to control the compensation circuit in applying the first compensation voltage to the first node between the first and second switching devices. In still another aspect, the controller is configured to turn on the second switching device during the first portion of the transition of the output voltage from the second rail voltage to the first rail voltage to form a first charging path from a source of the first compensation voltage to the output. In yet another aspect, the controller is configured to turn on both the first and second switching devices during the second portion of the transition of the output voltage from the second rail voltage to the first rail voltage to form a second charging path from the first voltage rail to the output.

In another aspect of the disclosure, the controller is configured to turn off both the third and fourth switching devices during the transition of the output voltage from the second rail voltage to the first rail voltage. And, in yet another aspect, the controller is configured to control the compensation circuit to apply the second compensation voltage to the second node between the third and fourth switching devices during the transition of the output voltage from the second rail voltage to the first rail voltage.

In another aspect of the disclosure, the compensation circuit is further configured to apply the second compensation voltage to the second node between the third and fourth switching devices during a first portion of a transition of the output voltage from the first rail voltage to the second rail voltage to maintain the second voltage across the third switching device at or below the second defined threshold during the first portion of the transition of the output voltage from the first rail voltage to the second rail voltage, and discontinue the application of the second compensation voltage to the second node between the third and fourth switching devices during a second portion of the transition of the output voltage from the first rail voltage to the second rail voltage.

In another aspect of the disclosure, the apparatus comprises a controller configured to control the compensation circuit in applying the second compensation voltage to the second node between the third and fourth switching devices. In yet another aspect, the controller is configured to turn on the third switching device during the first portion of the transition of the output voltage from the first rail voltage to the second rail voltage to form a first discharging path from the output to a source of the second compensation voltage. In still another aspect, the controller is configured to turn on both the third and fourth switching devices during the second portion of the transition of the output voltage from the first rail voltage to the second rail voltage to form a second discharging path from the output to the second voltage rail.

In another aspect of the disclosure, the controller is configured to turn off both the first and second switching devices during the transition of the output voltage from the first rail voltage to the second rail voltage. In still another aspect, the controller is configured to control the compensation circuit to apply the first compensation voltage to the first node between the first and second switching devices during the transition of the output voltage from the first rail voltage to the second rail voltage.

Other aspect of the disclosure relates to apparatus, components, modules, devices, encoded computer-readable storage mediums, and other elements configured to achieve the operations in accordance with the aforementioned method. In general, other aspects, advantages and novel features of the present disclosure will become apparent from the following detailed description of the disclosure when considered in conjunction with the accompanying drawings.

The word "exemplary" is used herein to mean "serving as an example, instance, or illustration." Any aspect described herein as "exemplary" is not necessarily to be construed as preferred or advantageous over other aspects."

DETAILED DESCRIPTION

Various aspects of the disclosure are described below. It should be apparent that the teachings herein may be embodied in a wide variety of forms and that any specific structure, function, or both being disclosed herein are merely representative. Based on the teachings herein one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

Figure 1A:
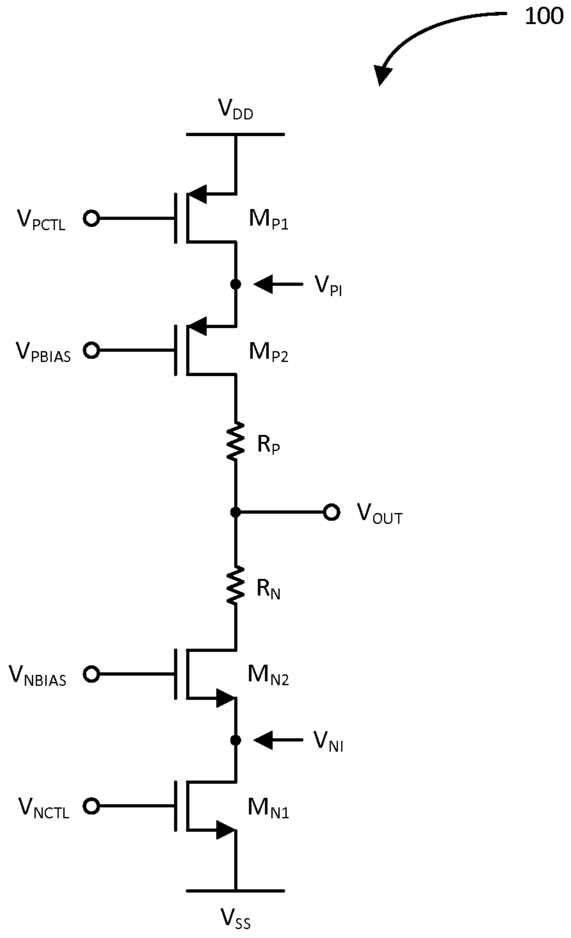
FIG. 1A illustrates a schematic diagram of an exemplary input/output (I/O) driver in accordance with an aspect of the disclosure.

FIG. 1A illustrates a schematic diagram of an exemplary input/output (I/O) driver 100 in accordance with an aspect of the disclosure. The I/O driver 100 comprises a pull-up circuit situated between a first voltage rail and an output of the I/O driver 100. The pull-up circuit is configured to couple the first voltage rail to the output to cause the voltage $V_{OUT}$ at the output of the I/O device 100 to be substantially at a steady-state first rail voltage $V_{DD}$ (e.g., +3.6V). The pull-up circuit is also configured to isolate the output of the I/O device 100 from the first voltage rail when the output voltage $V_{OUT}$ is substantially at a second rail voltage $V_{SS}$ (e.g., 0V). In this example, the pull-up circuit includes a pair of p-channel CMOS devices (PFETs) $M_{P1}$ and $M_{P2}$, and resistor R. The PFET $M_{P1}$ is responsive to a control signal $V_{PCTL}$ for turning on and off the PFET $M_{P1}$ in order to pull-up and isolate the output voltage $V_{OUT}$ to and from the first rail voltage $V_{DD}$, respectively.

The PFET $M_{P2}$ of the pull-up circuit may be biased with a substantially constant gate voltage $V_{PBIAS}$, which may be set to $V_{DD}/2$ (e.g., +1.8V). Configured as such, the PFET $M_{P2}$ turns on and off in response to the turning on and off of PFET $M_{P1}$ respectively. For instance, when control voltage $V_{PCTL}$ is substantially at $V_{DD}/2$ (e.g., +1.8V), the PFET $M_{P1}$ is turned on because $V_{GS}$ (e.g., 3.6V−1.8V=1.8V) is greater than the threshold voltage (e.g., 0.4V) of the device. The turning on of device PFET $M_{P1}$ causes $V_{DD}$ to be substantially applied to the source of PFET $M_{P2}$. Accordingly, PFET $M_{P2}$ turns on because $V_{GS}$ (e.g., 3.6V−1.8V=1.8V) is greater than the threshold voltage (e.g., 0.4V) of the device. Both PFETs $M_{P1}$ and $M_{P2}$ being turned on causes $V_{DD}$ to be applied substantially to the output of the I/O driver 100 by way of resistor $R_P$, which results in the output voltage $V_{OUT}$ to be at substantially $V_{DD}$ (e.g., ~3.6V). The resistor $R_P$ limits the current flow through the devices $M_{P1}$ and $M_{P2}$ to prevent overstressing or damaging of the devices.

Similarly, when control voltage $V_{PCTL}$ is substantially at $V_{DD}$ (e.g., +3.6V), the PFET $M_{P1}$ is turned off because $V_{GS}$ (e.g., 3.6V−3.6V=0V) is less than the threshold voltage (e.g., 0.4V) of the device. The device PFET $M_{P1}$ being turned off isolates $V_{DD}$ from the source of PFET $M_{P2}$, which causes the source of PFET $M_{P2}$ to settle to a voltage $V_{PI}$ no greater than a threshold voltage above $V_{PBIAS}$. Thus, PFET $M_{P2}$ is turned off because $V_{GS}$ does not exceed the threshold voltage of the device. With both PFETs $M_{P1}$ and $M_{P2}$ turned off, the output of the I/O driver 100 is substantially isolated from $V_{DD}$, allowing a pull-down circuit of the I/O driver 100 to control the state of the output, e.g., to place the output voltage $V_{OUT}$ at substantially the steady-state second rail voltage $V_{SS}$ (e.g., 0V). When the output voltage $V_{OUT}$ is at $V_{SS}$, the PFET $M_{P2}$ prevents the entire voltage difference between $V_{DD}$ and $V_{SS}$ to be applied across PFET $M_{P1}$, thereby preventing overstressing or damage to device $M_{P1}$.

The I/O driver 100 further comprises a pull-down circuit situated between the output of the I/O driver 100 and the second voltage rail. The pull-down circuit is configured to couple the output to the second voltage rail to cause the output voltage $V_{OUT}$ to be substantially at the steady-state second rail voltage $V_{SS}$. The pull-down circuit is also configured to isolate the output of the I/O device 100 from the second voltage rail when the output voltage $V_{OUT}$ is substantially at the first rail voltage $V_{DD}$. In this example, the pull-down circuit includes a pair of n-channel CMOS devices (NFETs) $M_{N1}$ and $M_{N2}$, and resistor $R_N$. The NFET $M_{N1}$ is responsive to a control signal $V_{NCTL}$ for turning on and off the NFET $M_{N1}$ in order to pull-down and isolate the output voltage $V_{OUT}$ to and from the second rail voltage $V_{SS}$, respectively.

The NFET $M_{N2}$ of the pull-down circuit may be biased with a substantially constant gate voltage $V_{NBIAS}$, which may be set to $V_{DD}/2$ (e.g., +1.8V). Configured as such, the NFET $M_{N2}$ turns on and off in response to the turning on and off of NFET $M_{N1}$, respectively. For instance, when control voltage $V_{NCTL}$ is at $V_{DD}/2$ (e.g., +1.8V), the NFET $M_{N1}$ is turned on because $V_{GS}$ (e.g., 1.8V-0V =1.8V) is greater than the threshold voltage (e.g., 0.4V) of the device. The turning on of device NFET $M_{N1}$ causes $V_{ss}$ to be substantially applied to the source of NFET $M_{N2}$. In response, NFET $M_{N2}$ turns on because $V_{GS}$ (e.g., 1.8V-0V =1.8V) is greater than the threshold voltage (e.g., 0.4V) of the device. Both NFETs $M_{NI}$ and $M_{N2}$ being turned on causes $V_{SS}$ to be applied substantially to the output of the I/O driver 100 by way of resistor $R_N$, which results in the output voltage $V_{OUT}$ to be substantially at the second rail voltage $V_{ss}$ (e.g., 0V). The resistor $R_N$ limits the current flow through the devices $M_{N1}$ and $M_{N2}$ to prevent overstressing or damaging of the devices.

Similarly, when control voltage $V_{NCTL}$ is at $V_{SS}$ (e.g., 0V), the NFET $M_{N1}$ is turned off because $V_{GS}$ (e.g., 0V−0V=0V) is less than the threshold voltage (e.g., 0.4V) of the device. The device NFET $M_{N1}$ being turned off isolates $V_{SS}$ from the source of NFET $M_{N2}$, which causes the source of NFET $M_{N2}$ to be no more than a threshold voltage below $V_{NBIAS}$. Accordingly, NFET $M_{N2}$ is turned off because $V_{GS}$ does not exceed the threshold voltage of the device. Both NFETs $M_{N1}$ and $M_{N2}$ being turned off results in the output being substantially isolated from the second voltage rail, allowing the pull-up circuit of the I/O driver 100 to control the state of the output, e.g., to place the output voltage $V_{OUT}$ substantially at the first rail voltage $V_{DD}$ (e.g., +3.6V). When the output voltage $V_{OUT}$ is at $V_{DD}$, the NFET $M_{N2}$ prevents the entire voltage difference between $V_{DD}$ and $V_{SS}$ to be applied across NFET $M_{N1}$, thereby preventing overstressing or damage to device $M_{N1}$.

Figure 1B:
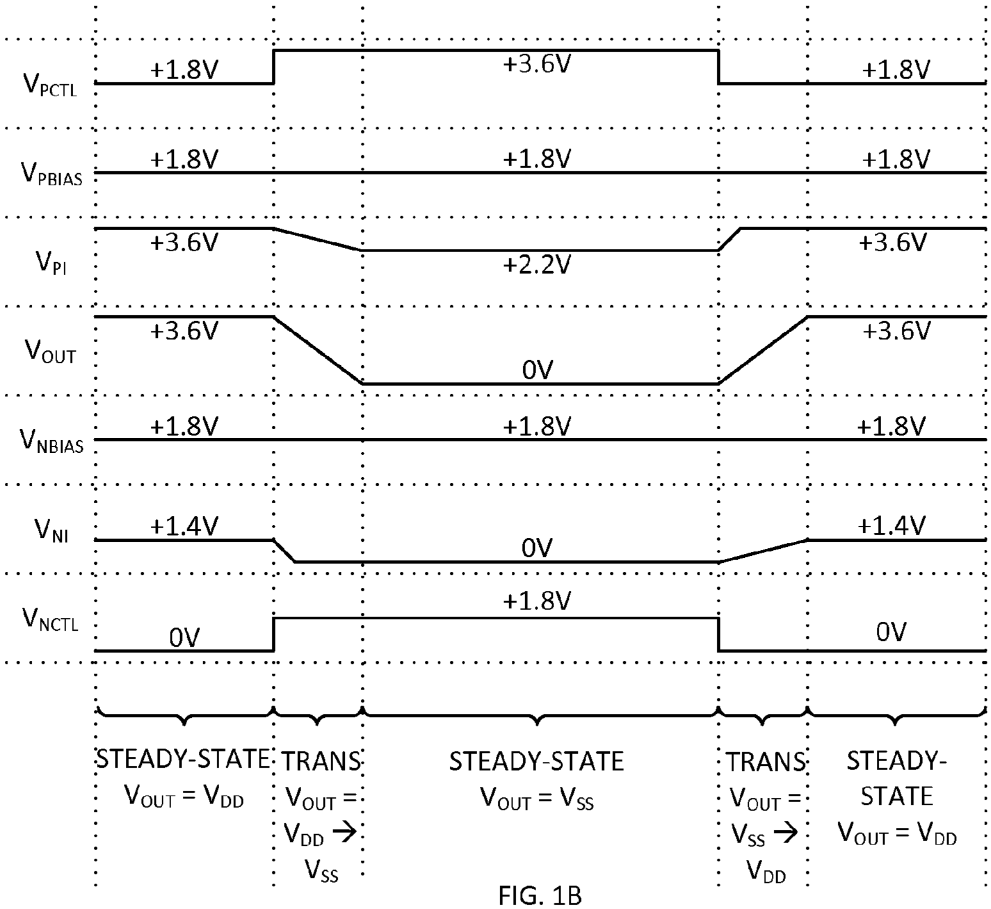
FIG. 1B illustrates a timing diagram of exemplary signals relevant to the operation of the exemplary I/O driver of FIG. 1A in accordance with another aspect of the disclosure.

FIG. 1B illustrates a timing diagram of exemplary signals relevant to the operation of the exemplary I/O driver 100 in accordance with another aspect of the disclosure. The x- or horizontal axis of the timing diagram represents time, and is divided into four states or time intervals: (1) when the output voltage $V_{OUT}$ of the I/O driver 100 is substantially at steady-state $V_{DD}$, which is indicated in the first and last columns of the timing diagram; (2) when the output voltage $V_{OUT}$ is transitioning from $V_{DD}$ to $V_{SS}$, which is indicated in the second column of the timing diagram; (3) when the output voltage $V_{OUT}$ of the I/O driver 100 is substantially at steady-state $V_{SS}$, which is indicated in the third column of the timing diagram; and (4) when the output voltage $V_{OUT}$ is transitioning from $V_{SS}$ to $V_{DD}$, which is indicated in the fourth column of the timing diagram.

The y- or vertical axis of the timing diagram represents the various voltages of the I/O driver 100. For instance, from top to bottom, the voltages are: (1) the control voltage $V_{PCTL}$ for PFET $M_{P1}$; (2) the gate bias voltage $V_{PBIAS}$ for PFET $M_{P2}$; (3) the voltage $V_{PI}$ at the source of PFET $M_{P2}$; (4) the output voltage $V_{OUT}$ of the I/O driver 100; (5) the gate bias voltage $V_{NBIAS}$ for NFET $M_{N2}$; (6) the voltage $V_{NI}$ at the source of NFET $M_{N2}$; and (7) the control voltage $V_{NCTL}$ for NFET $M_{N1}$.

In operation, during the state or time interval where the output voltage $V_{OUT}$ of the I/O driver 100 is substantially at $V_{DD}$ as indicated in the first column of the timing diagram, the control voltage $V_{PCTL}$ and the gate bias voltage $V_{PBIAS}$ are both at substantially $V_{DD}/2$ (e.g., +1.8V) in order to turn on both PFETs $M_{P1}$ and $M_{P2}$. The turning on of both PFETs $M_{P1}$ and $M_{P2}$ results in substantially coupling $V_{DD}$ to the output of the I/O driver 100, thereby causing the output voltage $V_{OUT}$ to be substantially at $V_{DD}$ (e.g., +3.6V). Also, the voltage $V_{PI}$ at the source of PFET $M_{P1}$ is also substantially at $V_{DD}$ (e.g., +3.6V). Further, during this state or time interval, the control voltage $V_{NCTL}$ is substantially at $V_{SS}$ (e.g., 0V) to turn off NFET $M_{N1}$. The gate bias voltage $V_{NBIAS}$ of NFET $M_{N2}$ is substantially at $V_{DD}/2$ (e.g., +1.8V). With NFET $M_{N1}$ being turned off, the voltage $V_{NI}$ at the source of NFET $M_{N2}$ will settle to no more than a threshold voltage below $V_{NBIAS}$, for example, to +1.4V. Thus, both NFET $M_{N1}$ and $M_{N2}$ are turned off to isolate the output of the I/O driver 100 from $V_{SS}$.

During the state or time interval where the output voltage $V_{OUT}$ of the I/O driver 100 is transitioning from $V_{DD}$ to $V_{SS}$ as indicated in the second column of the timing diagram, the control voltage $V_{PCTL}$ for PFET $M_{P1}$ is raised to substantially $V_{DD}$ (e.g., +3.6V) to turn off PFET $M_{P1}$. The gate bias voltage $V_{PBIAS}$ of PFET $M_{P2}$ remains substantially at $V_{DD}/2$ (e.g., +1.8V). Thus, the voltage $V_{PI}$ at the source of PFET $M_{P2}$ will settle no more than a threshold voltage above $V_{PBIAS}$, for example, to +2.2V. Thus, both PFET $M_{P1}$ and $M_{P2}$ are turned off to isolate the output of the I/O driver 100 from $V_{DD}$. Also, during this state or time interval, the control voltage $V_{NCTL}$ is raised to $V_{DD}/2$ (e.g., +1.8V) to turn on NFET $M_{N1}$. The turning on of NFET $M_{N1}$ causes the voltage $V_{NI}$ at the source of NFET $M_{N2}$ to decrease to $V_{SS}$ (e.g., 0V). The gate bias voltage of NFET $M_{N2}$ remains at $V_{DD}/2$ (e.g., +1.8V). Thus, the gate-to-source voltage $V_{GS}$ of NFET $M_{N2}$ is greater than the threshold voltage of the device $M_{N2}$, thereby causing NFET $M_{N2}$ to turn on. Both NFETs $M_{N1}$ and $M_{N2}$ being turned on causes the output voltage $V_{OUT}$ to decrease substantially to $V_{SS}$ (e.g., 0V).

Once the voltages have transitioned, they will remain substantially constant during the state or time interval where the output voltage $V_{OUT}$ is at substantially $V_{SS}$, as indicated in the third column. That is, the voltages $V_{PCTL}$ and $V_{PBIAS}$ are substantially constant at respectively $V_{DD}$ and $V_{DD}/2$ to keep devices $M_{P1}$ and $M_{P2}$ turned off to isolate the output from the first voltage rail. The source of PFET $M_{P2}$ remains substantially constant at no more than a threshold voltage above $V_{PBIAS}$ (e.g., +2.2V). The voltages $V_{NCTL}$ and $V_{NBIAS}$ are substantially constant at $V_{DD}/2$ to keep both devices $M_{N1}$ and $M_{N2}$ turned on to cause the output voltage $V_{OUT}$ to be substantially at the steady-state second rail voltage $V_{SS}$. Both devices MN1 and MN2 being turned on, the source $V_{NI}$ of NFET $M_{N2}$ settles to substantially $V_{SS}$ (e.g., 0V).

During the state or time interval where the output voltage $V_{OUT}$ of the I/O driver 100 is transitioning from $V_{SS}$ to $V_{DD}$ as indicated in the fourth column of the timing diagram, the control voltage $V_{PCTL}$ for PFET $M_{P1}$ is lowered to $V_{DD}/2$ (e.g., +1.8V) to turn on PFET $M_{P1}$. The gate bias voltage $V_{PBIAS}$ for PFET $M_{P2}$ remains at $V_{DD}/2$ (e.g.,+1.8V). Thus, both PFETs $M_{P1}$ and $M_{P2}$ turn on. Accordingly, the voltage $V_{P1}$ at the source of PFET $M_{P2}$ as well as the output voltage $V_{OUT}$ will increase to substantially $V_{DD}$ (e.g., +3.6 V). Also, during this state or time interval, the control voltage $V_{NCTL}$ is lowered to $V_{SS}$ (e.g., 0V) to turn off NFET $M_{N1}$. The gate bias voltage $V_{NBIAS}$ of NFET $M_{N2}$ remains at $V_{DD}/2$ (e.g., +1.8V). Accordingly, the voltage $V_{N1}$ at the source of NFET $M_{N2}$ increases to at least a threshold voltage below $V_{NBIAS}$, to, for example, +1.4V. Thus, the gate-to-source voltage $V_{GS}$ of NFET $M_{N2}$ does not exceed the threshold voltage of NFET $M_{N2}$, thereby causing NFET $M_{N2}$ to turn off. Both NFET $M_{N1}$ and $M_{N2}$ being turned off isolate the output voltage $V_{OUT}$ from $V_{SS}$ (e.g., 0V). Once the voltages have transitioned, they will remain substantially constant during the state or time interval where the output voltage $V_{OUT}$ is at substantially $V_{DD}$, as indicated in the last column.

There are a couple of issues with the I/O driver 100. For instance, if the devices $M_{p1}$, $M_{P2}$, $M_{N1}$, and $M_{N2}$ used in I/O driver 100 are manufactured in accordance with 45nm, 40nm or 28nm technology (e.g., to use the same technology for all other non-I/O devices in an integrated circuit), the maximum voltage across any terminals ($V_{GS}$, $V_{GD}$, and $V_{DS}$) of these devices is about +2.0V. If the devices are exposed to voltages above the reliable limit of +2.0V and for an extended period of time (e.g., a few picoseconds), recoverable or unrecoverable damage to these devices may result. Such damage may be due to negative bias temperature instability (NBTI), positive bias temperature instability (PBTI) or hot carrier injection (HCI). As a consequence, the performance and functionality of the devices may degrade or completely fail.

With reference again to FIG. 1B, when the output voltage $V_{OUT}$ is at steady-state $V_{DD}$ as indicated in the first and last columns of the timing diagram, the voltage at the drain of NFET $M_{N2}$ is substantially at $V_{DD}$ (e.g., +3.6V) and the voltage at the source of NFET $M_{N2}$ is at +1.4V. Thus, the voltage difference (e.g., $V_{DS}$) across the drain and source of NFET $M_{N2}$ is 2.2V. As previously discussed, this voltage differential of 2.2V across NFET $M_{N2}$ exceeds the reliability limit of +2.0 if this device was manufactured in accordance with 45 nm, 40 nm or 28 nm technology.

Further, during the state or time interval where the output voltage $V_{OUT}$ is transitioning from $V_{DD}$ to $V_{SS}$ as indicated in the second column of the timing diagram, the voltage $V_{NI}$ at the source of NFET $M_{N2}$ decreases from +1.4V to 0V at a rate much faster than the output voltage $V_{OUT}$ decreases from +3.6V to 0V, due to generally a larger load present at the output of the I/O driver 100. As a result, the voltage across the drain and source of NFET $M_{N2}$ increases up to about +2.8V during the transition of the output voltage $V_{OUT}$ from $V_{DD}$ to $V_{SS}$, again exceeding the reliability limit of 2.0V if the device is manufactured in accordance with 45 nm, 40 nm or 28 nm technology.

Similarly, when the output voltage $V_{OUT}$ is at steady-state $V_{SS}$ as indicated in the third column of the timing diagram, the voltage at the drain of the PFET $M_{P2}$ is substantially at $V_{SS}$ (e.g., 0V) and the voltage at the source of the PFET $M_{P2}$ is at +2.2V. Thus, the voltage difference (e.g., $V_{DS}$) across the drain and source of PFET $M_{P2}$ is 2.2V. As previously discussed, this voltage differential of 2.2V across PFET $M_{P2}$ would exceed the reliability limit of 2.0V if this device was manufactured in accordance with 45 nm, 40 nm or 28 nm technology.

Also, similarly, during the state or time interval where the output voltage $V_{OUT}$ is transitioning from $V_{SS}$ to $V_{DD}$ as indicated in the fourth column of the timing diagram, the voltage $V_{PI}$ at the source of PFET $M_{P2}$ increases from +2.2V to +3.6V at a rate much faster than the output voltage $V_{OUT}$ increases from 0V to +3.6V due to generally a larger load present at the output of the I/O driver 100. As a result, the voltage across the drain and source of PFET $M_{P2}$ increases up to about +2.8V during the transition of the output voltage $V_{OUT}$ from $V_{SS}$ to $V_{DD}$, again exceeding the reliability limit of 2.0V if the device is manufactured in accordance with 45 nm, 40 nm or 28 nm technology.

Figure 1C:
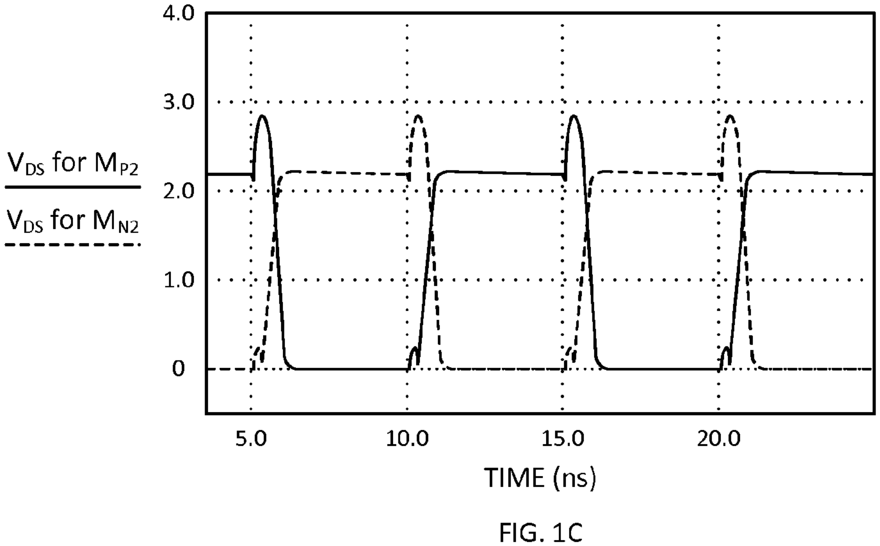
FIG. 1C illustrates a graph of exemplary voltages across respective devices used in the exemplary I/O driver of FIG. 1A in accordance with another aspect of the disclosure.

FIG. 1C illustrates a graph of exemplary voltages ($V_{DS}$) across respective devices $M_{P2}$ and $M_{N2}$ used in the exemplary I/O driver 100 in accordance with another aspect of the disclosure. As the graph illustrates, when the output voltage $V_{OUT}$ is substantially at steady-state $V_{DD}$ (e.g., +3.6V), which occurs in this graph between 6 nanoseconds (ns) and 10 ns, the voltage difference ($V_{DS}$) across the drain and source of NFET $M_{N2}$ is approximately at 2.2V, which exceeds the reliability limit of 2.0 for a 45 nm, 40 nm or 28 nm technology device. Also, during the transition of the output voltage $V_{OUT}$ from $V_{DD}$ to $V_{SS}$ (e.g., from +3.6V to 0V), which occurs in this graph between 10 ns and 11 ns, the voltage difference ($V_{DS}$) across the drain and source of NFET $M_{N2}$ spikes up to approximately 2.8V, which substantially exceeds the reliability limit of 2.0V for a 45 nm, 40 nm or 28 nm technology device.

Similarly, when the output voltage $V_{OUT}$ is substantially at steady-state $V_{SS}$ (e.g., 0V), which occurs in this graph between 11 ns and 15 ns, the voltage difference ($V_{DS}$) across the drain and source of PFET $M_{P2}$ is approximately at 2.2V, which exceeds the reliability limit of 2.0V for a 45 nm, 40 nm or 28 nm technology device. Also, during the transition of the output voltage $V_{OUT}$ from $V_{SS}$ to $V_{DD}$, which occurs in this graph between 15 ns and 16 ns, the voltage difference ($V_{DS}$) across the drain and source of PFET $M_{P2}$ spikes up to approximately 2.8V, which substantially exceeds the reliability limit of 2.0V for a 45 nm, 40 nm or 28 nm technology device.

Thus, there is a need to implement lower voltage devices, such as those manufactured in accordance with 45 nm, 40 nm or 28 nm technology, for I/O driver operations, while controlling the voltages across the devices so as to not exceed the reliability limits. A discussion of exemplary I/O drivers that achieve at least this end is provided below.

Figure 2A:
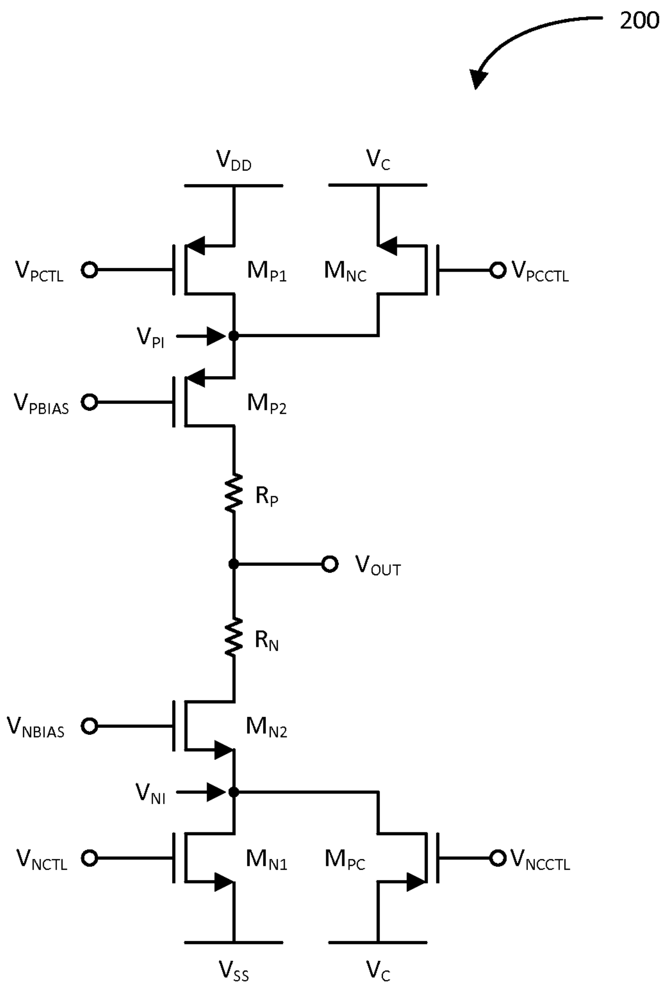
FIG. 2A illustrates a schematic diagram of another exemplary input/output (I/O) driver in accordance with another aspect of the disclosure.

FIG. 2A illustrates a schematic diagram of another exemplary input/output (I/O) driver 200 in accordance with another aspect of the disclosure. In summary, the I/O driver 200 is configured to apply a compensation voltage to the respective sources of PFET $M_{P2}$ and NFET $M_{N2}$ at a defined time and for a defined duration for the purpose of maintaining the voltage difference across the drain and source of these devices at or below the reliability limit or a defined threshold. Additionally, the gate bias voltages for the PFET $M_{P2}$ and NFET $M_{N2}$ are varied at a defined time and for a defined duration also for the purpose of maintaining the voltage difference across the drain and source of these devices at or below the reliability limit or a defined threshold.

In particular, the I/O driver 200 comprises a pull-up circuit including PFETs $M_{P1}$ and $M_{P2}$ and resistor R. The sources and drains of PFETs $M_{P1}$ and $M_{P2}$ are coupled in series with the resistor $R_P$ between a first voltage rail and an output of the I/O driver 200. A control voltage $V_{PCTL}$ for the pull-up circuit is applied to the gate of PFET $M_{P1}$. A gate bias voltage $V_{PBIAS}$ is applied to the gate of PFET $M_{P2}$ The operation of the pull-up circuit is similar to that of pull-up circuit of the I/O driver 100 previously discussed, with the exception that the gate bias voltage $V_{PBIAS}$ is varied in order to maintain the voltage difference across the gate and source of PFET $M_{P2}$ at or below the reliability limit or a defined threshold.

The I/O driver 200 further comprises a pull-up compensation circuit for applying a compensation voltage $V_C$ to the source of PFET $M_{P2}$ at a defined time and for a defined duration in order to maintain the voltage across the drain and source of PFET $M_{P2}$ at or below the reliability limit or a defined threshold. The pull-up compensation circuit comprises an NFET $M_{NC}$ having a source and drain coupled between a source of the compensation voltage $V_C$ and the source of PFET $M_{P2}$. A control voltage $V_{PCCTL}$ is applied to the gate of the NFET $M_{NC}$. The compensation voltage $V_C$ may be set to $V_{DD}/2$ (e.g., +1.8V).

The I/O driver 200 further comprises a pull-down circuit including NFETs $M_{N1}$ and $M_{N2}$ and resistor $R_N$. The resistor $R_N$ and the drains and sources of NFETs $M_{N1}$ and $M_{N2}$ are coupled in series between the output of the I/O driver 200 and a second voltage rail. A control voltage $V_{PCTL}$ for the pull-down circuit is applied to the gate of NFET $M_{N1}$. A gate bias voltage $V_{NBIAS}$ is applied to the gate of NFET $M_{N2}$ The operation of the pull-down circuit is similar to that of the pull-down circuit of the I/O driver 100 previously discussed, with the exception that the gate bias voltage $V_{NBIAS}$ is varied in order to maintain the voltage difference across the drain and source of NFET $M_{N2}$ at or below the reliability limit or a defined threshold.

The I/O driver 200 further comprises a pull-down compensation circuit for applying the compensation voltage $V_C$ to the source of NFET $M_{N2}$ at a defined time and for a defined duration in order to maintain the voltage difference across the drain and source of NFET $M_{N2}$ at or below the reliability limit or a defined threshold. The pull-down compensation circuit comprises a PFET $M_{PC}$ having a source and drain coupled between a source of the compensation voltage $V_C$ and the source of NFET $M_{N2}$. A control voltage $V_{NCCTL}$ is applied to the gate of the PFET $M_{PC}$. As previously discussed, the compensation voltage $V_C$ may be set to $V_{DD}/2$ (e.g., +1.8V). A discussion of the operation of the I/O driver 200 is provided below with reference to FIGS. 2B-2C.

Figure 2B:
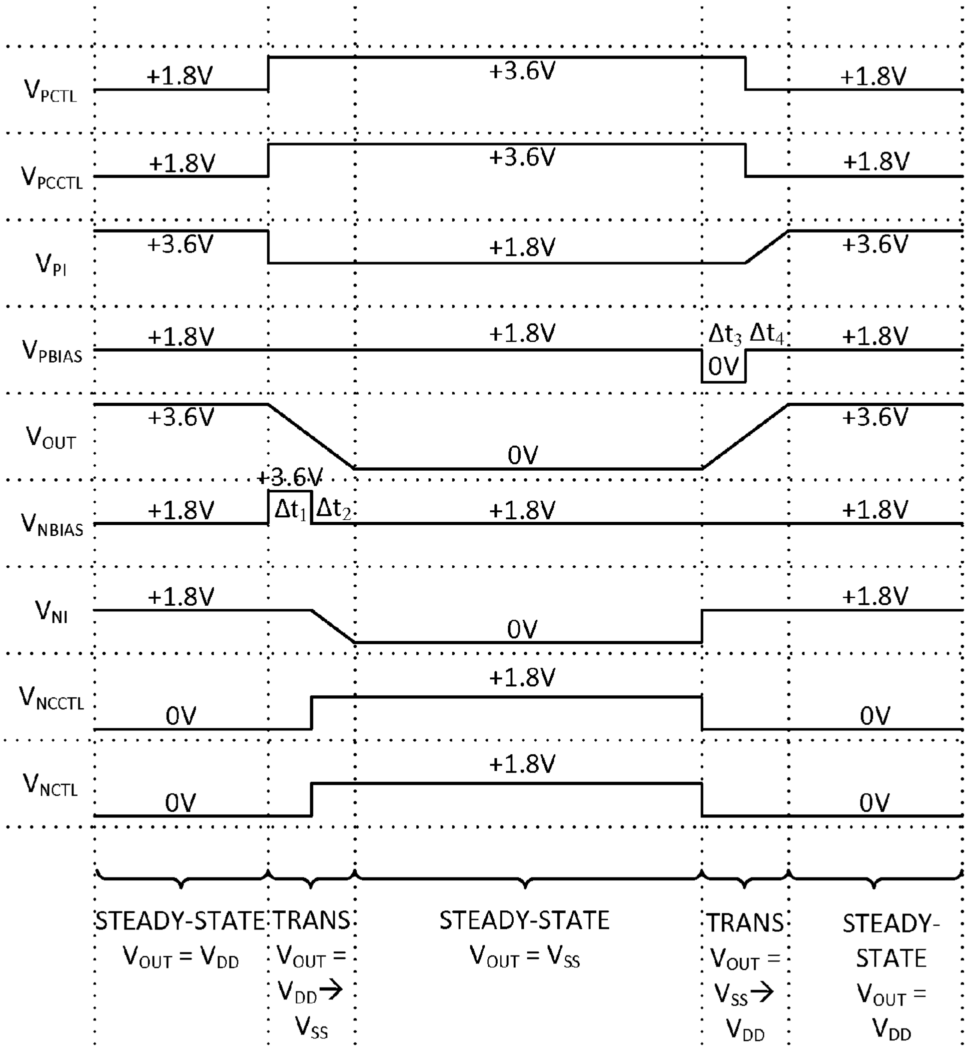
FIG. 2B illustrates a timing diagram of exemplary signals relevant to operation of the exemplary I/O driver of FIG. 2A in accordance with another aspect of the disclosure.

FIG. 2B illustrates a timing diagram of exemplary signals relevant to the operation of the exemplary I/O driver 200 in accordance with another aspect of the disclosure. The timing diagram is structured similarly to the timing diagram of FIG. 1B. In particular, the x- or horizontal axis of the timing diagram represents time, and is divided into four states or time intervals: (1) when the output voltage $V_{OUT}$ of the I/O driver 200 is substantially at steady-state $V_{DD}$, which is indicated in the first and last columns of the timing diagram; (2) when the output voltage $V_{OUT}$ is transitioning from $V_{DD}$ to $V_{SS}$, which is indicated in the second column of the timing diagram; (3) when the output voltage $V_{OUT}$ of the I/O driver 200 is substantially at steady-state $V_{SS}$, which is indicated in the third column of the timing diagram; and (4) when the output voltage $V_{OUT}$ is transitioning from $V_{SS}$ to $V_{DD}$, which is indicated in the fourth column of the timing diagram.

The y- or vertical axis of the timing diagram represents the various voltages of the I/O driver 200. For instance, from top to bottom, the voltages are: (1) the control voltage $V_{PCTL}$ for PFET $M_{P1}$; (2) the control voltage $V_{PCCTL}$ for NFET $M_{NC}$; (3) the voltage $V_{PI}$ at the source of PFET $M_{P2}$; (4) the gate bias voltage $V_{PBIAS}$ for PFET $M_{P2}$; (5) the output voltage $V_{OUT}$ of the I/O driver 200; (6) the gate bias voltage $V_{NBIAS}$ for NFET $M_{N2}$; (7) the voltage $V_{NI}$ at the source of NFETs $M_{N2}$; (8) the control voltage $V_{NCCTL}$ for the PFET $M_{PC}$; and (9) the control voltage $V_{NCTL}$ for NFET $M_{N1}$.

In operation, during the state or time interval where the output voltage $V_{OUT}$ of the I/O driver 200 is substantially at steady-state $V_{DD}$ as indicated in the first column of the timing diagram, the control voltage $V_{PCTL}$ and the gate bias voltage $V_{PBIAS}$ are both substantially at $V_{DD}/2$ (e.g., +1.8V) so that both PFETs $M_{P1}$ and $M_{P2}$ are turned on. Both PFETs $M_{P1}$ and $M_{P2}$ being turned on results in substantially coupling $V_{DD}$ to the output of the I/O driver 200, thereby causing the output voltage $V_{OUT}$ to be at substantially $V_{DD}$ (e.g., +3.6V). Also, at this state or time interval, the control voltage $V_{PCCTL}$ for the NFET $M_{NC}$ is set to $V_{DD}/2$ (e.g., +1.8V) to turn off NFET $M_{NC}$ to prevent the coupling of the compensation voltage $V_C$ to the source of PFET $M_{P2}$. Accordingly, the voltage $V_{PI}$ at the source of PFET $M_{P1}$ is also substantially at $V_{DD}$ (e.g., +3.6V).

Also, during this state or time interval, the control voltage $V_{NCTL}$ is set to $V_{SS}$ (e.g., 0V) to turn off NFET $M_{N1}$. The gate bias voltage $V_{NBIAS}$ of NFET $M_{N2}$ is set to $V_{DD}/2$ (e.g., +1.8V). The control voltage $V_{NCCTL}$ is set to $V_{SS}$ (e.g., 0V) to turn on PFET $M_{PC}$. The turning on of PFET $M_{PC}$ causes the compensation voltage $V_C$ to be applied to the source of NFET $M_{N2}$. Thus, the voltage across the drain and source of NFET $M_{N2}$ is substantially $V_{DD}/2$ (e.g., 1.8V), which is less than the reliability limit or defined threshold of 2.0V. Thus, when the output voltage $V_{OUT}$ is substantially at steady-state $V_{DD}$, the compensation voltage $V_C$ is applied to the source of NFET $M_{N2}$ in order to maintain the voltage across the drain and source of NFET $M_{N2}$ at or below the reliability limit of the device $M_{N2}$. This ensures that the device $M_{N2}$ is not overstressed or damaged due to voltages across its terminals that exceed its reliability limits. Since, during this state or time interval, the gate bias voltage $V_{NBIAS}$ of NFET $M_{N2}$ is substantially the same as the compensation voltage $V_C$ (i.e., $V_{DD}/2$), which is applied to the source of NFET $M_{N2}$, the device $M_{N2}$ is turned off. Thus, both NFET $M_{N1}$ and $M_{N2}$ are turned off to isolate the output of the I/O driver 200 from $V_{SS}$.

During the state or time interval where the output voltage $V_{OUT}$ of the I/O driver 200 is transitioning from $V_{DD}$ to $V_{SS}$ as indicated in the second column of the timing diagram, the control voltage $V_{PCTL}$ for PFET $M_{P1}$ is raised to $V_{DD}$ (e.g., +3.6V) to turn off PFET $M_{P1}$. The gate bias voltage $V_{PBIAS}$ of PFET $M_{P2}$ remains at $V_{DD}/2$ (e.g., +1.8V). The control voltage $V_{PCCTL}$ is raised to $V_{DD}$ (e.g., 3.6V) to turn on NFET $M_{NC}$ in order for the compensation voltage $V_C$ to be applied to the source of PFET $M_{P2}$. Since, the gate bias voltage $V_{PBIAS}$ of PFET $M_{P2}$ is substantially the same as the compensation voltage $V_C$ (e.g., $V_{DD}/2$), which is applied to the source of PFET $M_{P2}$, the device $M_{P2}$ is turned off. Thus, both PFETs $M_{P1}$ and $M_{P2}$ are turned off to isolate the output of the I/O driver 200 from $V_{DD}$. The compensation voltage $V_C$ being applied to the source of PFET $M_{P2}$ ensures that the voltage across the drain and source of PFET $M_{P2}$ is maintained at or below a reliability limit or defined threshold (e.g., 2.0V) when the output voltage $V_{OUT}$ reaches $V_{SS}$ (e.g., 0V).

Also, at substantially the beginning of the time interval where the output voltage $V_{OUT}$ is transitioning from $V_{DD}$ to $V_{SS}$, the gate control voltage $V_{NBIAS}$ for NFET $M_{N2}$ is raised to $V_{DD}$ (e.g., +3.6V) for a defined interval $\Delta t_1$ to turn on NFET $M_{N2}$. Also, during the defined time interval $\Delta t_1$, the control voltage $V_{NCTL}$ for NFET $M_{N1}$ is maintained at $V_{SS}$ (e.g., 0V) to maintain NFET $M_{N1}$ turned off, and the control voltage $V_{NCCTL}$ for PFET $M_{PC}$ is also maintained at $V_{SS}$ (e.g., 0V) to maintain PFET $M_{PC}$ turned on. Thus, during the first portion $\Delta t_1$ of the transition of the output voltage $V_{OUT}$ from $V_{DD}$ to $V_{SS}$, a first discharge path is formed from the output of the I/O driver 200 to the source of the compensation voltage $V_C$ by way of NFET $M_{N2}$ and PFET $M_{PC}$. This prevents the voltage across the drain and source of NFET $M_{N2}$ from exceeding the reliability limit or defined threshold during the initial phase of the transition of the output voltage from $V_{DD}$ to $V_{SS}$.

When the output voltage $V_{OUT}$ has decreased to a level where the difference between $V_{OUT}$ and $V_{SS}$ is at or below the defined threshold or the reliability limit of NFET $M_{N2}$ (e.g., ≤+2.0V), marking the end of the defined time interval $\Delta t_1$, the control voltage $V_{NCTL}$ for NFET $M_{N1}$ is raised to $V_{DD}/2$ (e.g., +1.8V) to turn on NFET $M_{N1}$, the control voltage $V_{NCCTL}$ for PFET $M_{PC}$ is also raised to $V_{DD}/2$ (e.g., +1.8V) to turn off PFET $M_{PC}$, and the gate bias voltage $V_{NBIAS}$ is lowered to $V_{DD}/2$ (e.g., +1.8V) to maintain NFET $M_{N2}$ turned on with a lower gate-to-source voltage (e.g., lower than the defined threshold or reliability limit of 2.0V). Thus, during the second portion $\Delta t_2$ of the transition of the output voltage $V_{OUT}$ from $V_{DD}$ to $V_{SS}$, a second discharge path is formed from the output of the I/O driver 200 to the second voltage rail by way of NFETs $M_{N2}$ and $M_{N1}$. Since, as discussed above, the output voltage $V_{OUT}$ has decreased to at or below the defined threshold or reliability limit of NFET $M_{N2}$ (e.g., (e.g., ≤+2.0V) at the beginning of the second time interval $\Delta t_2$, the turning on of NFET $M_{N1}$ and consequently applying $V_{SS}$ to the source of NFET $M_{N2}$ at the beginning of the second time interval $\Delta t_2$ does not cause any reliability problems for NFET $M_{N2}$ since the voltage across NFET $M_{N2}$ continues to stay at or below the reliability limit or defined threshold. Thus, during both portions $\Delta t_1$ and $\Delta t_2$, the voltage across the drain and source of NFET $M_{N2}$ remains at or below the defined threshold or reliability limit of the device $M_{N2}$.

Once the voltages have transitioned, they will remain substantially constant during the state or time interval where the output voltage $V_{OUT}$ is substantially at steady-state $V_{SS}$, as indicated in the third column of the timing diagram. That is, during this state or time interval, the control voltage $V_{PCTL}$ is at $V_{DD}$ (e.g., +3.6V) to keep PFET $M_{P1}$ turned off; the control voltage $V_{PCCTL}$ is at $V_{DD}$ to keep NFET $M_{NC}$ turned on so that the compensation voltage $V_C$ (e.g., +1.8V) is applied to the source of PFET $M_{P2}$ to maintain the voltage across the drain and source of PFET $M_{P2}$ at or below the reliability limit or defined threshold while the output voltage $V_{OUT}$ is at $V_{SS}$; the gate bias voltage $V_{PBIAS}$ for PFET $M_{P2}$ is at $V_{DD}/2$ (e.g., +1.8V) to keep PFET $M_{P2}$ turned off. Due to both PFETs $M_{P1}$ and $M_{P2}$ being turned off during this state or time interval, the pull-up circuit isolates the output from the first voltage rail, and the application of the compensation voltage $V_C$ to the source of PFET $M_{P2}$ ensures that the voltage across the device $M_{P2}$ is at or below the reliability limit or defined threshold.

Also, during the state or time interval where the output voltage $V_{OUT}$ is at substantially $V_{SS}$ as indicated in the third column of the timing diagram, the control voltage $V_{NCTL}$ for NFET $M_{N1}$ is at $V_{DD}/2$ (e.g., +1.8V) to maintain NFET $M_{N1}$ turned on; the control voltage $V_{NCCTL}$ for PFET $M_{PC}$ is at $V_{DD}/2$ (e.g., +1.8V) to maintain PFET $M_{PC}$ turned off to prevent the compensation voltage $V_C$ to be applied to the source of NFET $M_{N2}$; and the gate bias voltage $V_{NBIAS}$ for NFET $M_{N2}$ is at $V_{DD}/2$ (e.g., +1.8V) so that NFET $M_{N2}$ is turned on. Both NFETs $M_{N1}$ and $M_{N2}$ being turned on causes the second voltage rail to be coupled to the output of the I/O driver 200 to maintain the output voltage $V_{OUT}$ at substantially $V_{SS}$ (e.g., 0V). Consequently, the voltage $V_{NI}$ at the source of NFET $M_{N2}$ is also substantially at $V_{SS}$ (e.g., 0V).

During the state or time interval where the output voltage $V_{OUT}$ of the I/O driver 200 is transitioning from $V_{SS}$ to $V_{DD}$ as indicated in the fourth column of the timing diagram, the control voltage $V_{NCTL}$ for NFET $M_{N1}$ is lowered to $V_{SS}$ (e.g., 0V) to turn off NFET $M_{N1}$. The gate bias voltage $V_{NBIAS}$ of NFET $M_{N2}$ remains at $V_{DD}/2$ (e.g., +1.8V). The control voltage $V_{NCCTL}$ is lowered to $V_{SS}$ (e.g., 0V) to turn on PFET $M_{PC}$ in order for the compensation voltage $V_C$ (e.g., $V_{DD}/2$=+1.8V) to be applied to the source of NFET $M_{N2}$. Since, the gate bias voltage $V_{NBIAS}$ of NFET $M_{N2}$ is substantially the same as the compensation voltage $V_C$ (both being $V_{DD}/2$ or +1.8V), which is applied to the source of NFET $M_{P2}$, the device $M_{N2}$ is turned off. Thus, both NFETS $M_{N1}$ and $M_{N2}$ are turned off to isolate the output of the I/O driver 200 from the second voltage rail. The compensation voltage $V_C$ being applied to the source of NFET $M_{N2}$ ensures that the voltage across the drain and source of NFET $M_{N2}$ is maintained at or below a reliability limit or defined threshold (e.g., ≤+2.0V) when the output voltage $V_{OUT}$ reaches $V_{DD}$ (e.g., +3.6V).

Also, at substantially the beginning of the time interval where the output voltage $V_{OUT}$ is transitioning from $V_{SS}$ to $V_{DD}$, the gate control voltage $V_{PBIAS}$ for PFET $M_{P2}$ is lowered to $V_{SS}$ (e.g., 0V) for a defined interval $\Delta t_3$ to turn on PFET $M_{P2}$. Also, during the defined time interval $\Delta t_3$, the control voltage $V_{PCTL}$ for PFET $M_{P1}$ is maintained at $V_{DD}$ (e.g., +3.6V) to maintain PFET $M_{P1}$ turned off, and the control voltage $V_{PCCTL}$ for NFET $M_{NC}$ is also maintained at $V_{DD}$ (e.g., +3.6V) to maintain NFET $M_{NC}$ turned on. Thus, during a first portion $\Delta t_3$ of the transition of the output voltage $V_{OUT}$ from $V_{SS}$ to $V_{DD}$, a first charge path is formed from the source of the compensation voltage $V_C$ to the output of the I/O driver 200 by way of NFET $M_{NC}$ and PFET $M_{P2}$. This prevents the voltage across the drain and source of PFET $M_{P2}$ from exceeding the reliability limit or defined threshold during the initial phase of the transition of the output voltage $V_{OUT}$ from $V_{SS}$ to $V_{DD}$.

When the output voltage $V_{OUT}$ has increased to a level where the difference between $V_{DD}$ and $V_{OUT}$ is at or below the defined threshold or the reliability limit of PFET $M_{P2}$ (e.g., ≤+2.0V), marking the end of the defined time interval $\Delta t_3$, the control voltage $V_{PCTL}$ for PFET $M_{P1}$ is lowered to $V_{DD}/2$ (e.g., +1.8V) to turn on PFET $M_{P1}$, the control voltage $V_{PC-}$ $_{CTL}$ for NFET $M_{NC}$ is also lowered to $V_{DD}/2$ (e.g., +1.8V) to turn off NFET $M_{NC}$, and the gate bias voltage $V_{PBIAS}$ is raised to $V_{DD}/2$ (e.g., +1.8V) to maintain PFET $M_{P2}$ turned on with a lower gate-to-source voltage (e.g., lower than the defined threshold or reliability limit of 2.0V). Thus, during the second portion $\Delta t_4$ of the transition of the output voltage $V_{OUT}$ from $V_{SS}$ to $V_{DD}$, a second charge path is formed from the first voltage rail to the output of the I/O driver 200 by way of PFETs $M_{P1}$ and $M_{P2}$. Since, as discussed above, the output voltage $V_{OUT}$ has increased to a level where the difference between $V_{DD}$ and $V_{OUT}$ is at or below the defined threshold or reliability limit of PFET $M_{P2}$ (e.g., (e.g., ≤+2.0V) at the beginning of the second time interval $\Delta t_3$, the turning on of PFET $M_{P1}$ and consequently, the coupling of $V_{DD}$ to the source of PFET $M_{P2}$ at the beginning of the second time interval $\Delta t_4$ does not cause any reliability problems for PFET $M_{P2}$ since the voltage across PFET $M_{P2}$ continues to stay at or below the reliability limit or defined threshold. Thus, during both portions $\Delta t_a$ and $\Delta t_4$, the voltage across the drain and source of PFET $M_{P2}$ remains at or below the defined threshold or reliability limit of the device $M_{P2}$. Once the voltages have transitioned, they will remain substantially constant during the state or time interval where the output voltage $V_{OUT}$ is at substantially $V_{DD}$, as indicated in the last (or first) column of the timing diagram.

Figure 2C:
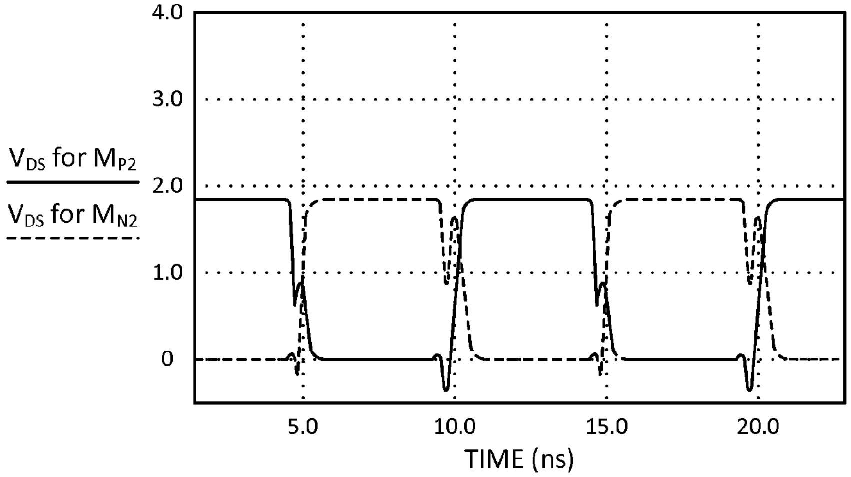
FIG. 2C illustrates a graph of exemplary voltages across respective devices used in the exemplary I/O driver of FIG. 2A in accordance with another aspect of the disclosure.

FIG. 2C illustrates a graph of exemplary voltages $V_{is}$ across respective devices $M_{P2}$ and $M_{N2}$ used in the exemplary I/O driver 200 in accordance with another aspect of the disclosure. As the graph illustrates, when the output voltage $V_{OUT}$ is substantially at steady-state $V_{DD}$ (e.g., +3.6V), which occurs in this graph between 5 ns and 9 ns, the voltage ($V_{DS}$) across the drain and source of NFET $M_{N2}$ is approximately at 1.8V, which does not exceed the reliability limit of 2.0V for a 45 nm, 40 nm or 28 nm technology device. Also, during the transition of the output voltage $V_{OUT}$ from $V_{DD}$ to $V_{SS}$ (e.g., from +3.6V to 0V), which occurs in this graph between 9 ns and 10 ns, the voltage ($V_{DS}$) across the drain and source of NFET $M_{N2}$ does not exceed the reliability limit of 2.0V for a 45 nm, 40 nm or 28 nm technology device.

Similarly, when the output voltage $V_{OUT}$ is substantially at steady-state $V_{SS}$ (e.g., 0V), which occurs in this graph between 10 ns to 14 ns, the voltage ($V_{DS}$) across the drain and source of PFET $M_{P2}$ is approximately at 1.8V, which does not exceed the reliability limit of 2.0V for a 45 nm, 40 nm or 28 nm technology device. Also, during the transition of the output voltage $V_{OUT}$ from $V_{SS}$ to $V_{DD}$, which occurs in this graph between 14 ns and 15 ns, the voltage ($V_{DS}$) across the drain and source of PFET $M_{P2}$ does not exceed the reliability limit of 2.0V for a 45 nm, 40 nm or 28 nm technology device. Thus, the I/O driver 200 allows for lower voltage devices (e.g., 45 nm, 40 nm or 28 nm technology device) for applications that require higher output voltages (e.g., +3.6V).

Figure 3:
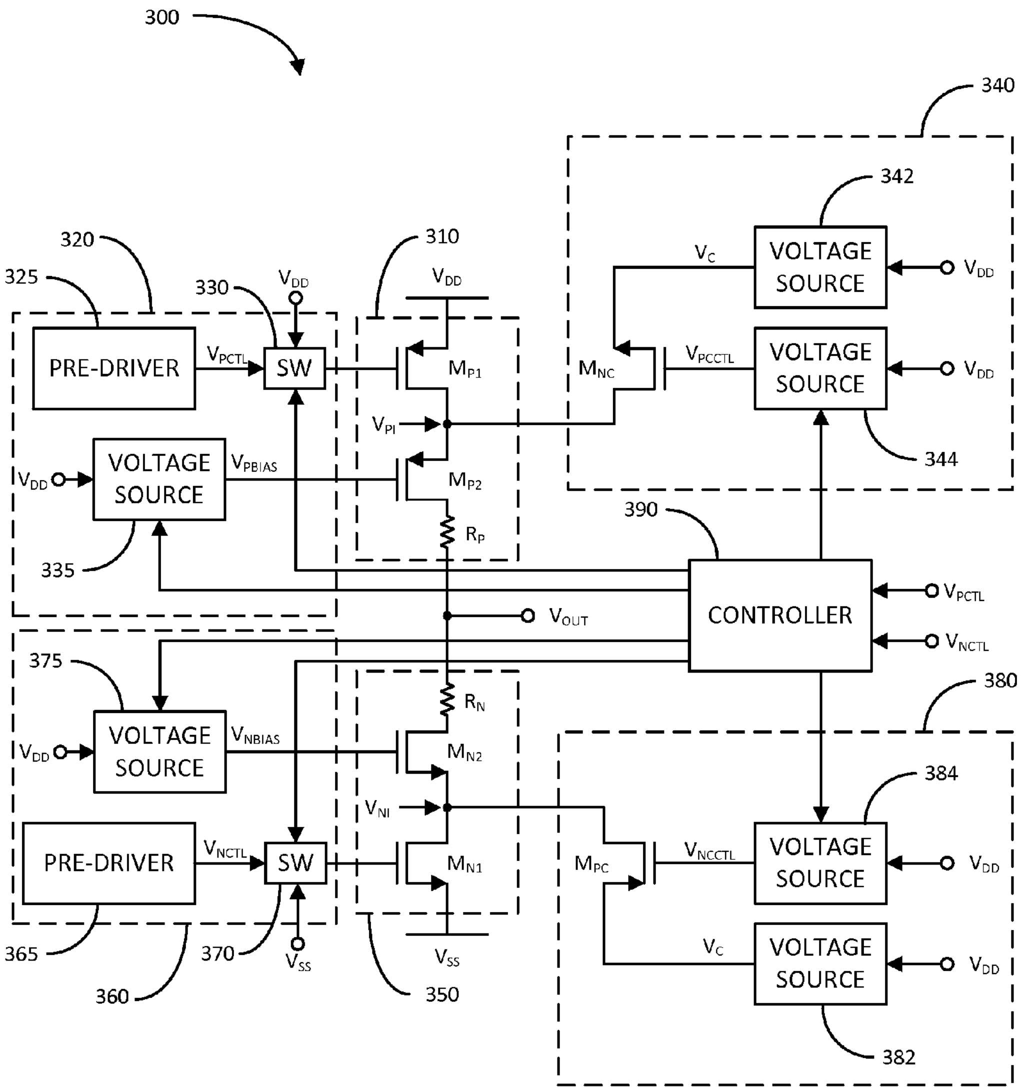
FIG. 3 illustrates a schematic diagram of yet another exemplary input/output (I/O) driver in accordance with another aspect of the disclosure.

FIG. 3 illustrates a schematic diagram of yet another exemplary input/output (I/O) driver 300 in accordance with another aspect of the disclosure. The I/O driver 300 may be an exemplary detailed implementation of the I/O driver 200 previously discussed. The I/O driver 300 comprises a pull-up circuit 310, a pull-up control circuit 320, a pull-up compensation circuit 340, a pull-down circuit 350, a pull-down control circuit 360, a pull-down compensation circuit 380, and a controller 390.

The pull-up circuit 310, in turn, comprises switching devices $M_{P1}$ and $M_{P2}$ and $R_P$, all coupled in series between a first voltage rail and an output of the I/O driver 300. Although, in this example, the switching devices $M_{P1}$ and $M_{P2}$ are illustrated as p-channel CMOS, it shall be understood that the devices may comprise any type of switching device, including other types of field effect transistors as well as other types of bipolar transistors. The switching devices $M_{P1}$ and $M_{P2}$ perform at least two functions: (1) to couple the first voltage rail to the output so that the output voltage $V_{OUT}$ may be maintained substantially at a steady-state first rail voltage $V_{DD}$; and (2) to isolate the output from the first voltage rail when the output voltage $V_{OUT}$ is at a steady-state second rail voltage $V_{SS}$.

The pull-down circuit 350, in turn, comprises switching devices $M_{N1}$ and $M_{N2}$ and resistor $R_N$, all coupled in series between the output of the I/O driver 300 and a second voltage rail. Although, in this example, the switching devices $M_{N1}$ and $M_{N2}$ are illustrated as n-channel CMOS, it shall be understood that the devices may comprise any type of switching device, including other types of field effect transistors as well as other types of bipolar transistors. The switching devices $M_{N1}$ and $M_{N2}$ perform at least two functions: (1) to couple the output to the second voltage rail so that the output voltage $V_{OUT}$ may be maintained substantially at the steady-state second rail voltage ($V_{SS}$); and (2) to isolate the output from the second voltage rail when the output voltage $V_{OUT}$ is at the steady-state first rail voltage ($V_{DD}$).

The pull-up control circuit 320 is configured to generate control voltages $V_{PCTL}$ and $V_{PBIAS}$ for the pull-up circuit 310 under the control of the controller 390. The pull-up control circuit 320 comprises a pre-driver 325, a two-pole-one-throw switching device 330, and a voltage source 335. The pre-driver 325 generates control voltage $V_{PCTL}$ based on a command to drive the output voltage $V_{OUT}$ to either the first rail voltage $V_{DD}$ or the second rail voltage $V_{SS}$. For instance, if the command dictates that the output voltage $V_{OUT}$ is to be driven to the first rail voltage $V_{DD}$, then the pre-driver 325 generates the control voltage $V_{PCTL}$ at substantially $V_{DD}/2$ in order to cause switching device $M_{P1}$ to turn on. Conversely, if the command dictates that the output voltage $V_{OUT}$ is to be driven to the second rail voltage $V_{SS}$, then the pre-driver 325 generates the $V_{PCTL}$ at substantially $V_{DD}$ in order to cause switching device $M_{P1}$ to turn off.

The voltage source 335 generates a bias voltage $V_{PBIAS}$ for switching device $M_{P2}$. With an exception as discussed further herein, the bias voltage $V_{PBIAS}$ is substantially constant and set to $V_{DD}/2$. Thus, with bias voltage $V_{PBIAS}$ set accordingly, the switching device $M_{P2}$ turns on in response to switching device $M_{P1}$ turning on, and turns off in response to switching device $M_{P1}$ turning off. Hence, in response to the control voltage $V_{PCTL}$ set to $V_{DD}/2$, both switching devices $M_{P1}$ and $M_{P2}$ are turned on to couple the first voltage rail to the output, so that the output voltage $V_{OUT}$ may be maintained substantially at the steady-state first rail voltage $V_{DD}$. And, in response to the control voltage $V_{PCTL}$ set to $V_{DD}$, both switching devices $M_{P1}$ and $M_{P2}$ are turned off to isolate the output from the first voltage rail when the output voltage $V_{OUT}$ is substantially at the steady-state second rail voltage $V_{SS}$. As discussed in more detail herein, the two-pole-one-throw switching device 330 and the voltage source 335 being controllable by the controller 390 are for the purpose of maintaining the voltage across the switching device $M_{P2}$ at or below a defined threshold during operation of the I/O driver 300.

The pull-down control circuit 360 is configured to generate control voltages VNCTL and $V_{NBIAS}$ for the pull-down circuit 360 under the control of the controller 390. The pull-down control circuit 360 comprises a pre-driver 365, a two-pole-one-throw switching device 370, and a voltage source 375. The pre-driver 365 generates control voltage $V_{NCTL}$ based on a command to drive the output voltage $V_{OUT}$ to either the first rail voltage $V_{DD}$ or the second rail voltage $V_{SS}$. For instance, if the command dictates that the output voltage $V_{OUT}$ is to be driven to the second rail voltage $V_{SS}$, the pre-driver 365 generates the control voltage $V_{NCTL}$ at substantially $V_{DD}/2$ in order to cause switching device $M_{N1}$ to turn on. Conversely, if the command dictates that the output voltage $V_{OUT}$ is to be driven to the first rail voltage $V_{DD}$, the pre-driver 365 generates the $V_{NCTL}$ at substantially $V_{SS}$ in order to cause switching device $M_{N1}$ to turn off.

The voltage source 375 generates a bias voltage $V_{NBIAS}$ for switching device $M_{N2}$. With an exception as discussed further herein, the bias voltage $V_{NBIAS}$ is substantially constant and set to $V_{DD}/2$. Thus, with bias voltage $V_{NBIAS}$ set accordingly, the switching device $M_{N2}$ turns on in response to switching device $M_{N1}$ turning on, and turns off in response to switching device $M_{N1}$ turning off. Hence, in response to the control voltage $V_{NCTL}$ set to $V_{DD}/2$, both switching devices $M_{N1}$ and $M_{N2}$ are turned on to couple the second voltage rail to the output so that the output voltage $V_{OUT}$ may be maintained substantially at the steady-state second rail voltage $V_{SS}$. And, in response to the control voltage $V_{NCTL}$ set to $V_{SS}$, both switching devices $M_{N1}$ and $M_{N2}$ are turned off to isolate the output from the second voltage rail when the output voltage $V_{OUT}$ is substantially at the steady-state first rail voltage $V_{DD}$. As discussed in more detail herein, the two-pole-one-throw switching device 370 and the voltage source 375 being controllable by the controller 390 are for the purpose of maintaining the voltage across the switching device $M_{N2}$ at or below a defined threshold during operation of the I/O driver 300.

The pull-up compensation circuit 340 is configured to apply a compensation voltage $V_C$ to the node between the switching devices $M_{P1}$ and $M_{P2}$ at the appropriate time and duration for the purpose of maintaining the voltage across the switching device $M_{P2}$ at or below the defined threshold during operation of the I/O driver 300. The pull-up compensation circuit 340 comprises a voltage source 342 for generating the compensation voltage $V_C$ (which may be set to substantially $V_{DD}/2$), a switching device $M_{NC}$ coupled between the voltage source 342 and the node between the switching devices $M_{P1}$ and $M_{P2}$, and a voltage source 344 for generating a control voltage $V_{PCCTL}$ for the switching device $M_{NC}$ under the control of the controller 390. Although, in this example, the switching device $M_{NC}$ is illustrated as an n-channel CMOS, it shall be understood that the device may be configured as any type of switching device, including other types of field effect transistors as well as other types of bipolar transistors.

The maintaining of the voltage across the switching device $M_{P2}$ at or below the defined threshold operates as follows. When the output voltage $V_{OUT}$ is at the steady-state second voltage rail $V_{SS}$, the controller 390 issues a command to the voltage source 344 to generate the control voltage $V_{PCCTL}$ at substantially $V_{DD}$ to turn on switching device $M_{NC}$. The turning on of switching device $M_{NC}$ causes the compensation voltage $V_C$ to be applied to the node between switching devices $M_{P1}$ and $M_{P2}$. Thus, the voltage across switching device $M_{P2}$ is substantially $V_{DD}/2$, which is the difference between the compensation voltage $V_C$ at $V_{DD}/2$ and the output voltage $V_{OUT}$ at $V_{SS}$. This voltage difference $V_{DD}/2$ may be at or below a reliability limit or threshold for the switching device $M_{P2}$.

When the output voltage $V_{OUT}$ begins transitioning from the second rail voltage $V_{SS}$ to the first rail voltage $V_{DD}$ due to control voltages $V_{PCTL}$ and $V_{NCTL}$ being driven to $V_{DD}/2$ and $V_{SS}$, respectively, the controller 390 operates the switching device 330 to couple $V_{DD}$ (instead of $V_{PCTL}$) to the switching device $M_{P1}$ to maintain the switching device $M_{P1}$ off during a first portion of the transition of the output voltage $V_{OUT}$ from the second rail voltage $V_{SS}$ to the first rail voltage $V_{DD}$. Additionally, during the first portion, the controller 390 operates the voltage source 335 to produce $V_{PBIAS}$ at substantially $V_{SS}$ to maintain switching device $M_{P2}$ turned on. This forms a first charge path from the compensation voltage source 342 to the output by way of switching devices $M_{NC}$ and $M_{P2}$ to charge the output voltage $V_{OUT}$ from $V_{SS}$ to $V_{DD}/2$. Thus, the maximum voltage across the switching device $M_{P2}$ during the first portion is $V_{DD}/2$, the difference between the compensation voltage $V_C$ and the second rail voltage $V_{SS}$, which again may be at or below the reliability limit or threshold for the switching device $M_{P2}$.

At the start of a second portion of the output voltage $V_{OUT}$ transitioning from the second rail voltage $V_{SS}$ to the first rail voltage $V_{DD}$, which could be marked when the output voltage $V_{OUT}$ reaches $V_{DD}/2$, the controller 390 controls the voltage source 344 to change the control voltage $V_{PCCTL}$ to $V_{DD}/2$ in order to turn off switching device $M_{NC}$. This decouples the compensation voltage $V_C$ from the node between the first and second switching devices $M_{P1}$ and $M_{P2}$. Also, the controller 390 operates the switching device 330 to couple the control voltage $V_{PCTL}$ (instead of $V_{DD}$) to the switching device $M_{P1}$ to turn on device $M_{P1}$. Additionally, the controller 390 controls the voltage source 335 to produce $V_{PBIAS}$ at substantially $V_{DD}/2$ to maintain switching device $M_{P2}$ turned on. This forms a second charge path from the first voltage rail to the output by way of switching devices $M_{P1}$ and $M_{P2}$ to complete the charging of the output voltage $V_{OUT}$ to $V_{DD}$. Again, the maximum voltage across the switching device $M_{P2}$ during the second portion is $V_{DD}/2$, the difference between the first rail voltage $V_{DD}$ and the output voltage $V_{OUT}$ at the start of the second portion of the transition of the output voltage from $V_{SS}$ to $V_{DD}$.

The pull-down compensation circuit 380 is configured to apply a compensation voltage $V_C$ to the node between switching devices $M_{N1}$ and $M_{N2}$ at the appropriate time and duration for the purpose of maintaining the voltage across the switching device $M_{N2}$ at or below the defined threshold during operation of the I/O driver 300. The pull-down compensation circuit 380 comprises a voltage source 382 for generating the compensation voltage $V_C$ (which may be set to substantially $V_{DD}/2$), a switching device $M_{PC}$ coupled between the voltage source 382 and the node between switching devices $M_{N1}$ and $M_{N2}$, and a voltage source 384 for generating a control voltage $V_{NCCTL}$ for the switching device $M_{PC}$ under the control of the controller 390. Although, in this example, the switching device $M_{PC}$ is illustrated as a p-channel CMOS, it shall be understood that the device may be configured as any type of switching device, including other types of field effect transistors as well as other types of bipolar transistors. Additionally, although two different voltage sources 342 and 382 for the compensation voltage $V_C$ are illustrated to facilitate explanation, it shall be understood that there may be a single voltage source for the compensation voltage $V_C$.

The maintaining of the voltage across the switching device $M_{N2}$ at or below the defined threshold operates as follows. When the output voltage $V_{OUT}$ is substantially at the steady-state first rail voltage $V_{DD}$, the controller 390 issues a command to the voltage source 384 to produce the control voltage $V_{NCCTL}$ at substantially $V_{SS}$ to turn on switching device $M_{PC}$. The turning on of switching device $M_{PC}$ causes the compensation voltage $V_C$ to be applied to the node between switching devices $M_{N1}$ and $M_{N2}$. Thus, the voltage across switching device $M_{N2}$ is substantially $V_{DD}/2$, which is the difference between the output voltage $V_{OUT}$ at $V_{SS}$ and the compensation voltage $V_C$ at $V_{DD}/2$. This voltage difference $V_{DD}/2$ may be at or below a reliability limit or threshold for the switching device $M_{N2}$.

When the output voltage $V_{OUT}$ begins transitioning from the first rail voltage $V_{DD}$ to the second rail voltage $V_{SS}$ due to control voltages $V_{PCTL}$ and $V_{NCTL}$ being driven to $V_{DD}$ and $V_{DD}/2$, respectively, the controller 390 operates the switching device 370 to couple $V_{SS}$ (instead of $V_{NCTL}$) to the switching device $M_{N1}$ to maintain the switching device $M_{N1}$ off during a first portion of the transition of the output voltage $V_{OUT}$ from the first rail voltage $V_{DD}$ to the second rail voltage $V_{SS}$. Additionally, during the first portion, the controller 390 operates the voltage source 375 to produce $V_{NBIAS}$ at substantially $V_{DD}$ to maintain switching device $M_{N2}$ turned on. This forms a first discharge path from the output to the voltage source 382 by way of switching devices $M_{N2}$ and $M_{PC}$ to discharge the output voltage $V_{OUT}$ from $V_{DD}$ to $V_{DD}/2$. Thus, the maximum voltage across the switching device $M_{N2}$ during the first portion is $V_{DD}/2$, the difference between the first rail voltage $V_{DD}$ and the compensation voltage $V_C$, which again may be at or below the reliability limit or threshold for the switching device $M_{N2}$.

At the start of a second portion of the output voltage $V_{OUT}$ transitioning from the first rail voltage $V_{DD}$ to the second rail voltage $V_{SS}$, which could be marked when the output voltage $V_{OUT}$ has decayed to approximately $V_{DD}/2$, the controller 390 controls the voltage source 384 to change the control voltage $V_{NCCTL}$ to $V_{DD}/2$ in order to turn off switching device $M_{PC}$. This decouples the compensation voltage $V_C$ from the node between the switching devices $M_{N1}$ and $M_{N2}$. Also, the controller 390 operates the switching device 370 to couple the control voltage $V_{NCTL}$ to the switching device $M_{N1}$ to turn on device $M_{N1}$. Additionally, the controller 390 controls the voltage source 375 to produce the bias voltage $V_{NBIAS}$ to $V_{DD}/2$ to maintain switching device $M_{N2}$ turned on. This forms a second discharge path from the output to the second voltage rail by way of switching devices $M_{N1}$ and $M_{N2}$ to complete the discharging of the output voltage $V_{OUT}$ to $V_{SS}$. Again, the maximum voltage across the switching device $M_{N2}$ during the second portion is $V_{DD}/2$, the difference between the output voltage $V_{OUT}$ at the start of the second portion and the second rail voltage $V_{SS}$.

Figures 1, 4:
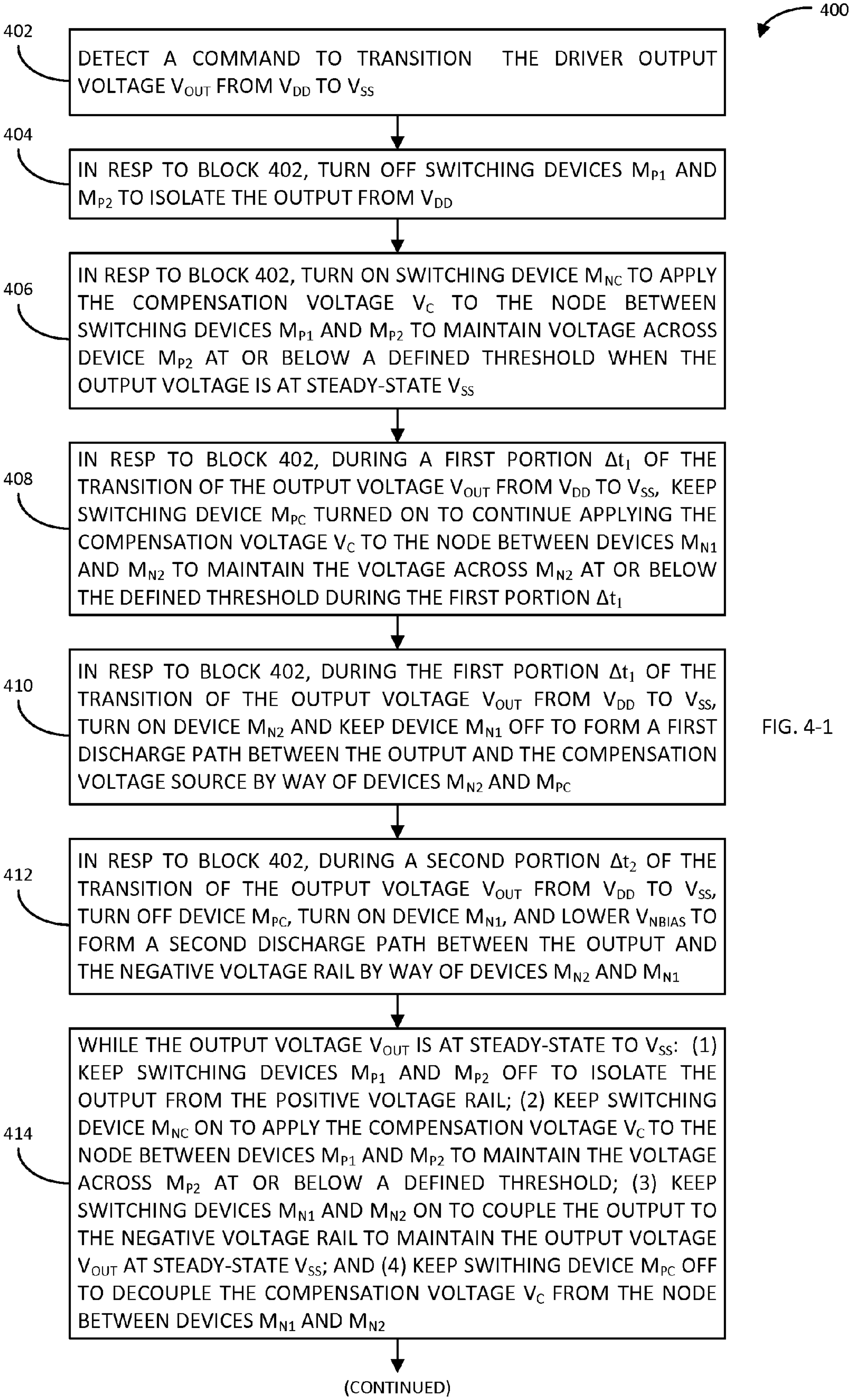
FIGS. 4-1 to 4-2 illustrate a flow diagram of an exemplary method of operating the I/O driver of FIG. 3 in accordance with another aspect of the disclosure.
Figures 2, 4:
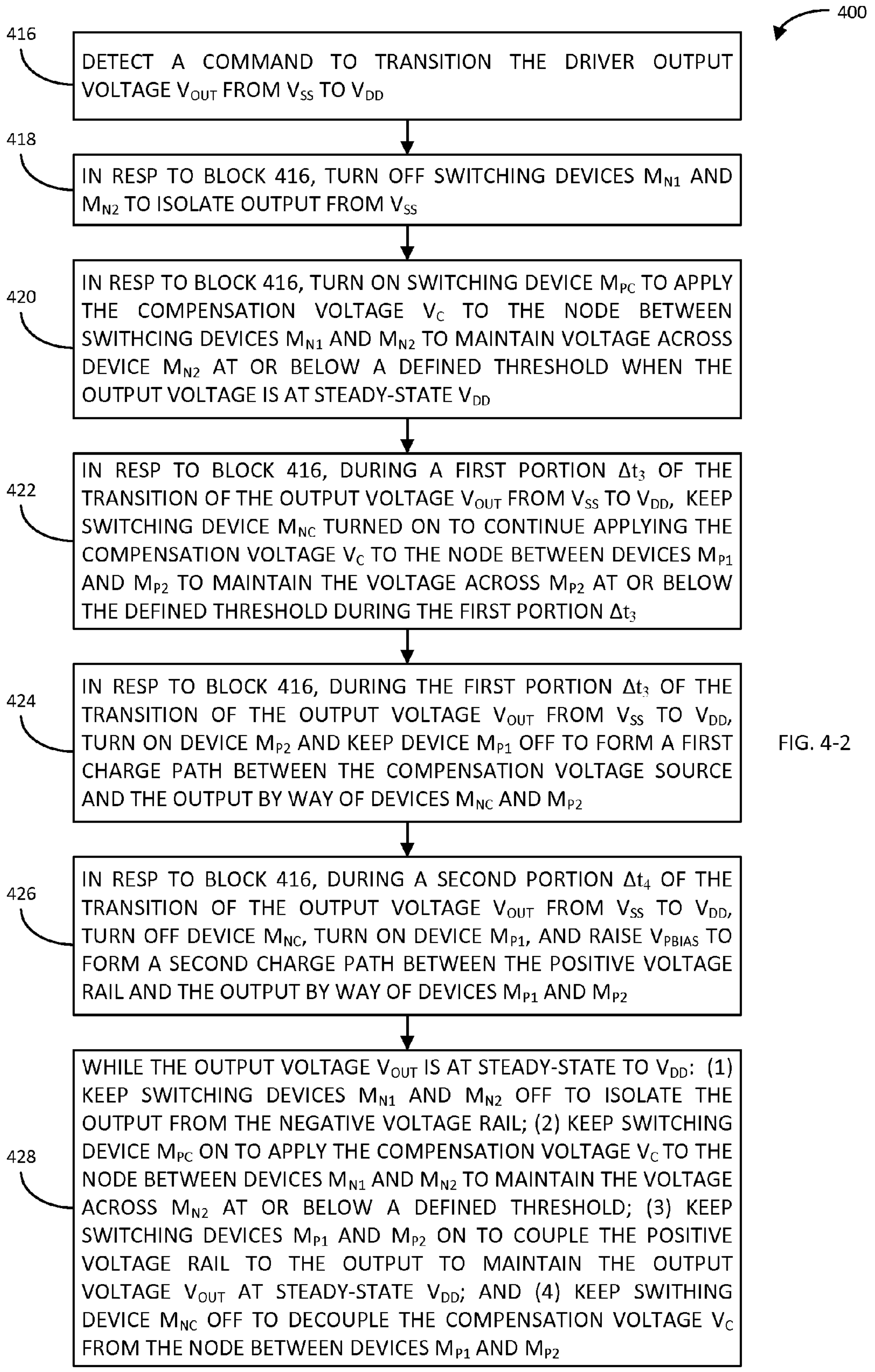

FIGS. 4-1 and 4-2 illustrate an exemplary method 400 of generating an output voltage by the I/O driver 300 in accordance with another aspect of the disclosure. The method 400 summarizes the operations taken by the I/O driver 300 in switching the output voltage $V_{OUT}$ between the first rail voltage $V_{DD}$ and the second rail voltage $V_{SS}$, while maintaining the respective voltages across the switching devices $M_{P2}$ and $M_{N2}$ at or below a defined threshold, such as the reliability limit of the devices.

According to the method 400, the controller 390 detects a command to transition the output voltage $V_{OUT}$ from the first rail voltage $V_{DD}$ to the second rail voltage $V_{SS}$ (block 402). The controller 390 may detect this command by monitoring the state of control voltages $V_{PCTL}$ and $V_{NCTL}$. For instance, when control voltages $V_{PCTL}$ and $V_{NCTL}$ transition to respectively $V_{DD}$ and $V_{DD}/2$, this indicates a command to transition the output voltage $V_{OUT}$ from $V_{DD}$ to $V_{SS}$. In response to detecting the command pursuant to block 402, the controller 390 maintains the switching device 330 at a state where the control voltage $V_{PCTL}$ is applied to switching device $M_{P1}$ to turn off device $M_{P1}$, and the controller 390 maintains the voltage source 335 producing a bias voltage $V_{PBIAS}$ at $V_{DD}/2$ so that switching device $M_{P2}$ turns off in response to switching device $M_{P1}$ turning off (block 404). Thus, the operation in block 404 is performed to isolate the output from the first voltage rail.

Also, in response to detecting the command to transition the output voltage $V_{OUT}$ from $V_{DD}$ to $V_{SS}$ pursuant to block 402, the controller 390 configures the voltage source 344 to produce the control voltage $V_{PCCTL}$ at $V_{DD}$ in order to turn on switching device $M_{NC}$ (block 406). This causes the compensation voltage $V_C$ to be applied to the node between switching devices $M_{P1}$ and $M_{P2}$ in order to maintain the voltage across switching device $M_{P2}$ at or below a defined threshold when the output voltage $V_{OUT}$ is substantially at the steady-state second rail voltage $V_{SS}$.

Also, in response to detecting the command to transition the output voltage $V_{OUT}$ from $V_{DD}$ to $V_{SS}$ pursuant to block 402, the controller 390 maintains the voltage source 384 producing $V_{NCCTL}$ at $V_{SS}$ in order to maintain switching device $M_{PC}$ turned on to maintain the voltage across switching device $M_{N2}$ at or below the defined threshold for a first portion of the transition of the output voltage $V_{OUT}$ from $V_{DD}$ to $V_{SS}$ (block 408). Additionally, during the first portion, the controller 390 operates the voltage source 375 to produce the bias voltage $V_{NBIAS}$ at substantially $V_{DD}$ to turn on switching device $M_{N2}$, and operates the switching device 370 to couple $V_{SS}$ to the switching device $M_{N1}$ (instead of $V_{NCTL}$) in order to maintain switching device $M_{N1}$ off, during the first portion of the transition of the output voltage from $V_{DD}$ to $V_{SS}$ (block 410). The operations of blocks 408 and 410 result in a first discharging path being formed between the output and the compensation voltage source 382 by way of switching device $M_{N2}$ and $M_{PC}$ in order to discharge the output voltage $V_{OUT}$ from substantially $V_{DD}$ to $V_{DD}/2$ during the first portion of the transition.

When the output voltage $V_{OUT}$ has reached approximately $V_{DD}/2$, the controller 390 configures the voltage source 384 to produce the control voltage $V_{NCCTL}$ at $V_{DD}/2$ in order to turn off switching device $M_{PC}$, operates the switching device 370 to couple $V_{NCTL}$ to switching device $M_{N1}$ (instead of $V_{SS}$) to turn on device $M_{N1}$, and operates the voltage source 375 to produce the $V_{NBIAS}$ at $V_{DD}/2$ to maintain switching device $M_{P2}$ turned on while keeping the voltage across the terminals of the device $M_{P2}$ below the defined threshold (block 412). The operations of block 412 result in a second discharging path formed between the output and the second voltage rail by way of switching device $M_{N2}$ and $M_{N1}$ in order to complete the discharging of the output voltage $V_{OUT}$ from substantially $V_{DD}/2$ to $V_{SS}$ during the second or remaining portion of the transition of $V_{OUT}$ from $V_{DD}$ to $V_{SS}$.

As specified in block 414, while the output voltage $V_{OUT}$ is substantially at the steady-state second rail voltage $V_{SS}$, the controller 390: (1) maintains switching devices $M_{P1}$ and $M_{P2}$ turned off to isolate the output from the first voltage rail; (2) maintains switching device $M_{NC}$ turned on to couple the compensation voltage $V_C$ to the node between devices $M_{P1}$ and $M_{P2}$ to maintain the voltage across device $M_{P2}$ at or below a defined threshold; (3) maintains switching devices $M_{N1}$ and $M_{N2}$ turned on to couple the output to the second voltage rail to maintain the output voltage $V_{OUT}$ at substantially the steady-state second rail voltage $V_{SS}$; and (4) maintains the switching device $M_{PC}$ off to decouple the compensation voltage $V_C$ from the node between switching devices $M_{N1}$ and $M_{N2}$.

At a later time, the controller 390 detects a command to transition the output voltage $V_{OUT}$ from the second rail voltage $V_{SS}$ to the first rail voltage $V_{DD}$ (block 416). The controller 390 may detect this command by monitoring the state of control voltages $V_{PCTL}$ and $V_{NCTL}$. For instance, when control voltages $V_{PCTL}$ and $V_{NCTL}$ transition to $V_{DD}/2$ and $V_{SS}$, respectively, this indicates a command to transition the output voltage $V_{OUT}$ from $V_{SS}$ to $V_{DD}$. In response to detecting the command pursuant to block 416, the controller 390 maintains the switching device 370 at a state where the control voltage $V_{NCTL}$ is applied to switching device $M_{N1}$ to turn off device $M_{N1}$, and maintains the voltage source 375 producing a bias voltage $V_{NBIAS}$ at $V_{DD}/2$ so that switching device $M_{N2}$ turns off in response to switching device $M_{N1}$ turning off (block 418). Thus, the operations in block 418 are performed to isolate the output from the second voltage rail.

Also, in response to detecting the command to transition the output voltage $V_{OUT}$ from $V_{SS}$ to $V_{DD}$ pursuant to block 416, the controller 390 configures the voltage source 384 to produce the control voltage $V_{NCCTL}$ at $V_{SS}$ in order to turn on switching device $M_{PC}$ (block 420). This causes the compensation voltage $V_C$ to be applied to the node between switching devices $M_{N1}$ and $M_{N2}$ in order to maintain the voltage across switching device $M_{N2}$ at or below a defined threshold when the output voltage $V_{OUT}$ is substantially at the steady-state first rail voltage $V_{DD}$.

Also, in response to detecting the command to transition the output voltage $V_{OUT}$ from $V_{SS}$ to $V_{DD}$ pursuant to block 416, the controller 390 maintains the voltage source 344 producing $V_{PCCTL}$ at $V_{DD}$ in order to maintain switching device $_{MNC}$ turned on to maintain the voltage across switching device $M_{P2}$ at or below the defined threshold for a first portion of the transition of the output voltage $V_{OUT}$ from $V_{SS}$ to $V_{DD}$ (block 422). Additionally, during the first portion, the controller 390 operates the voltage source 335 to produce the bias voltage $V_{PBIAS}$ at substantially $V_{SS}$ to turn on switching device $M_{P2}$, and operates the switching device 330 to couple $V_{DD}$ to the switching device $M_{P1}$ (instead of $V_{VPCTL}$) in order to maintain switching device $M_{P1}$ turned off, during the first portion of the transition of the output voltage from $V_{SS}$ to $V_{DD}$(block 424). The operations of blocks 420 and 422 result in a first charging path formed between the compensation voltage source 342 and the output by way of switching device $M_{NC}$ and $M_{P2}$ in order to charge the output voltage $V_{OUT}$ from substantially $V_{SS}$ to $V_{DD}/2$ during the first portion of the transition.

When the output voltage $V_{OUT}$ has reached approximately $V_{DD}/2$, the controller 390 configures the voltage source 344 to produce the control voltage $V_{PCCTL}$ at $V_{DD}/2$ in order to turn off switching device $M_{NC}$, operates the switching device 330 to couple $V_{PCTL}$ to switching device $M_{P1}$ (instead of $V_{DD}$) to turn on device $M_{P1}$, and operates the voltage source 335 to produce $V_{PBIAS}$ at substantially $V_{DD}/2$ to maintain switching device MP1 turned on which maintaining the voltage across the terminals at or below the defined threshold (block 426). The operations of block 422 result in a second charging path being formed from the first voltage rail to the output rail by way of switching device $M_{P2}$ and $M_{P1}$ in order to complete the charging of the output voltage $V_{OUT}$ from substantially $V_{DD}/2$ to $V_{DD}$ during the second or remaining portion of the transition of $V_{OUT}$ from $V_{SS}$ to $V_{DD}$.

As specified in block 428, while the output voltage $V_{OUT}$ is at substantially the steady-state first rail voltage $V_{DD}$, the controller 390: (1) maintains switching devices $M_{N1}$ and $M_{N2}$ turned off to isolate the output from the second voltage rail; (2) maintains switching device $M_{PC}$ turned on to couple the compensation voltage $V_C$ to the node between devices $M_{N1}$ and $M_{N2}$ to maintain the voltage across device $M_{N2}$ at or below a defined threshold; (3) maintains switching devices $M_{P1}$ and $M_{P2}$ turned on to couple the first voltage rail to the output to maintain the output voltage $V_{OUT}$ at substantially the steady-state first rail voltage $V_{DD}$; and (4) maintains the switching device $M_{NC}$ off to decouple the compensation voltage $V_C$ from the node between switching devices $M_{P1}$ and $M_{P2}$.

Figure 5:
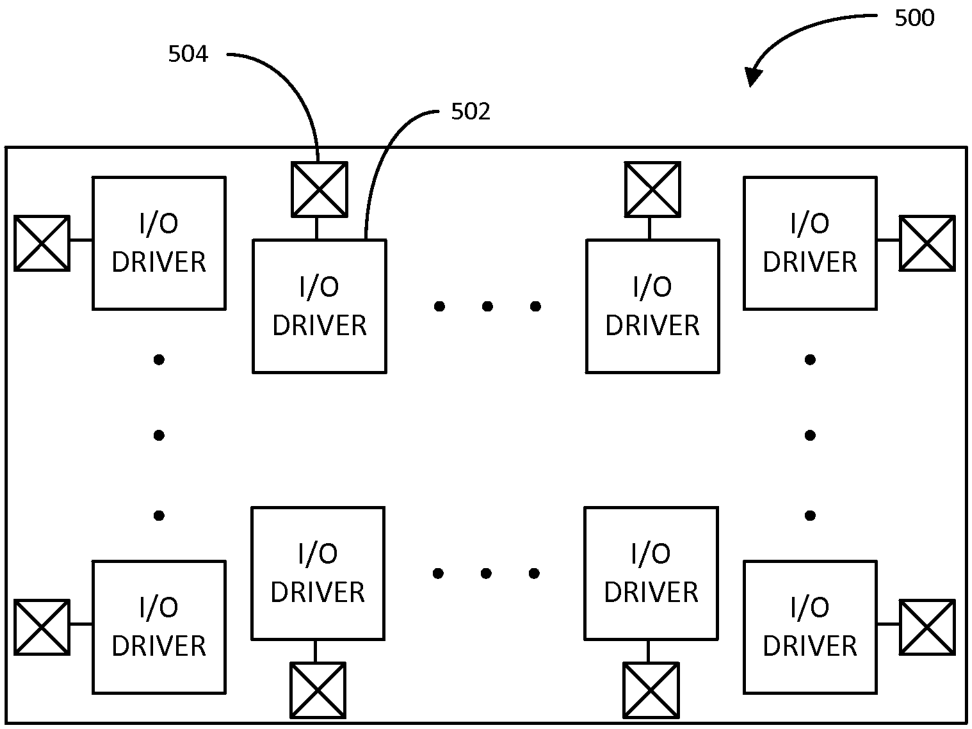
FIG. 5 illustrates a top representative view of an exemplary integrated circuit that employs a plurality of I/O drivers in accordance with another aspect of the disclosure.

FIG. 5 illustrates a top representative view of an exemplary integrated circuit 500 that employs one or more I/O drivers in accordance with another aspect of the disclosure. As shown, the integrated circuit 500 comprises a plurality of I/O drivers 502 coupled to corresponding I/O pads 504. The I/O drivers 502 described herein may be used as output devices to produce an output signal based on input signals generated by circuitry internal to the integrated circuit 500. In such a case, the outputs of the I/O drivers 502 are coupled to output pads 504 to generate output signals thereto.

Various aspects of the disclosure have been described above. It should be apparent that the teachings herein may be embodied in a wide variety of forms and that any specific structure, function, or both being disclosed herein is merely representative. Based on the teachings herein one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using another structure, functionality, or structure and functionality in addition to or other than one or more of the aspects set forth herein. As an example of some of the above concepts, in some aspects concurrent channels may be established based on pulse repetition frequencies. In some aspects concurrent channels may be established based on pulse position or offsets. In some aspects concurrent channels may be established based on time hopping sequences. In some aspects concurrent channels may be established based on pulse repetition frequencies, pulse positions or offsets, and time hopping sequences.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Also, it should be understood that any reference to an element herein using a designation such as “first,” “second,” and so forth does not generally limit the quantity or order of those elements. Rather, these designations are generally used herein as a convenient method of distinguishing between two or more elements or instances of an element. Thus, a reference to first and second elements does not mean that only two elements may be employed there or that the first element must precede the second element in some manner. Also, unless stated otherwise a set of elements comprises one or more elements. In addition, terminology of the form “at least one of A, B, or C” or “one or more of A, B, or C” or “at least one of the group consisting of A, B, and C” used in the description or the claims means “A or B or C or any combination of these elements.”

As used herein, the term “determining” encompasses a wide variety of actions. For example, “determining” may include calculating, computing, processing, deriving, investigating, looking up (e.g., looking up in a table, a database or another data structure), ascertaining, and the like. Also, “determining” may include receiving (e.g., receiving information), accessing (e.g., accessing data in a memory), and the like. Also, “determining” may include resolving, selecting, choosing, establishing, and the like.

Those of skill in the art understand that information and signals may be represented using any of a variety of different technologies and techniques. For example, any data, instructions, commands, information, signals, bits, symbols, and chips referenced throughout the above description may be represented by voltages, currents, electromagnetic waves, magnetic fields or particles, optical fields or particles, or any combination thereof.

Those of skill would further appreciate that the various illustrative logical blocks, modules, processors, means, circuits, and algorithm steps described in connection with the aspects disclosed herein may be implemented as electronic hardware (e.g., a digital implementation, an analog implementation, or a combination of the two, which may be designed using source coding or some other technique), various forms of program or design code incorporating instructions (which may be referred to herein, for convenience, as "software" or a "software module"), or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented within or performed by an integrated circuit ("IC"), an access terminal, or an access point. The IC may comprise a general purpose processor, a digital signal processor (DSP), an application specific integrated circuit (ASIC), a field programmable gate array (FPGA) or other programmable logic device, discrete gate or transistor logic, discrete hardware components, electrical components, optical components, mechanical components, or any combination thereof designed to perform the functions described herein, and may execute codes or instructions that reside within the IC, outside of the IC, or both. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

It is understood that any specific order or hierarchy of steps in any disclosed process is an example of a sample approach. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of a user terminal 120 (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processor may be responsible for managing the bus and general processing, including the execution of software stored on the machine-readable media. The processor may be implemented with one or more general-purpose and/or special-purpose processors. Examples include microprocessors, microcontrollers, DSP processors, and other circuitry that can execute software. Software shall be construed broadly to mean instructions, data, or any combination thereof, whether referred to as software, firmware, middleware, microcode, hardware description language, or otherwise. Machine-readable media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product. The computer-program product may comprise packaging materials.

In a hardware implementation, the machine-readable media may be part of the processing system separate from the processor. However, as those skilled in the art will readily appreciate, the machine-readable media, or any portion thereof, may be external to the processing system. By way of example, the machine-readable media may include a transmission line, a carrier wave modulated by data, and/or a computer product separate from the wireless node, all which may be accessed by the processor through the bus interface. Alternatively, or in addition, the machine-readable media, or any portion thereof, may be integrated into the processor, such as the case may be with cache and/or general register files.

A processing system may include hardware, software, firmware or any combination thereof. The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC (Application Specific Integrated Circuit) with the processor, the bus interface, the user interface in the case of an access terminal), supporting circuitry, and at least a portion of the machine-readable media integrated into a single chip, or with one or more FPGAs (Field Programmable Gate Arrays), PLDs (Programmable Logic Devices), controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

The machine-readable media may comprise a number of software modules. The software modules include instructions that, when executed by the processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

If implemented in software, the functions may be stored or transmitted over as one or more instructions or code on a computer-readable medium. Computer-readable media include both computer storage media and communication media including any medium that facilitates transfer of a computer program from one place to another. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc where disks usually reproduce data magnetically, while discs reproduce data optically with lasers. Thus, in some aspects computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media.

Thus, certain aspects may comprise a computer program product for performing the operations presented herein. For example, such a computer program product may comprise a computer-readable medium having instructions stored (and/or encoded) thereon, the instructions being executable by one or more processors to perform the operations described herein. In some aspects, a computer-readable medium comprises codes executable to perform one or more operations as taught herein. For certain aspects, the computer program product may include packaging material.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

The previous description of the disclosed aspects is provided to enable any person skilled in the art to make or use the present disclosure. Various modifications to these aspects will be readily apparent to those skilled in the art, and the generic principles defined herein may be applied to other aspects without departing from the scope of the disclosure. Thus, the present disclosure is not intended to be limited to the aspects shown herein but is to be accorded the widest scope consistent with the principles and novel features disclosed herein.

What is claimed is:

1. An apparatus, comprising:

a pull-up circuit comprising first and second switching devices coupled in series between a first voltage rail and an output, wherein the first and second switching devices are configured to turn on to cause a voltage at the output to be substantially at a steady-state first rail voltage, and wherein the first and second switching devices are configured to turn off to isolate the output from the first voltage rail when the output voltage is substantially at a steady-state second rail voltage;

a pull-down circuit comprising third and fourth switching devices coupled in series between the output and a second voltage rail, wherein the third and fourth switching devices are configured to turn on to cause the output voltage to be substantially at the steady-state second rail voltage, and wherein the third and fourth switching devices are configured to turn off to isolate the output from the second voltage rail when the output voltage is substantially at the steady-state first rail voltage; and a compensation circuit configured to:

apply a first compensation voltage to a first node between the first and second switching devices to maintain a first voltage across the second switching device at or below a first defined threshold, the first defined threshold being substantially less than a difference between the first and second rail voltages;

apply a second compensation voltage to a second node between the third and fourth switching devices to maintain a second voltage across the third switching device at or below a second defined threshold, the second defined threshold being substantially less than the difference between the first and second rail voltages; or apply the first compensation voltage to the first node between the first and second switching devices to maintain the first voltage across the second switching device at or below the first defined threshold, and apply the second compensation voltage to the second node between the third and fourth switching devices to maintain the second voltage across the third switching device at or below the second defined threshold.

2. The apparatus of claim 1, wherein the compensation circuit is further configured to apply the first compensation voltage to the first node between the first and second switching devices to maintain the first voltage across the second switching device at or below the first defined threshold when the output voltage is substantially at the steady-state second rail voltage.

3. The apparatus of claim 1, wherein the compensation circuit is further configured to apply the second compensation voltage to the second node between the third and fourth switching devices to maintain the second voltage across the third switching device at or below the second defined threshold when the output voltage is substantially at the steady-state first rail voltage.

4. The apparatus of claim 1, wherein the compensation circuit is further configured to apply the first compensation voltage to the first node between the first and second switching devices during at least a portion of a transition of the output voltage from the second rail voltage to the first rail voltage to maintain the first voltage across the second switching device at or below the first defined threshold during the transition of the output voltage from the second rail voltage to the first rail voltage.

5. The apparatus of claim 1, wherein the compensation circuit is further configured to apply the second compensation voltage to the second node between the third and fourth switching devices during at least a portion of a transition of the output voltage from the first rail voltage to the second rail voltage to maintain the second voltage across the third switching device at or below the second defined threshold during the transition of the output voltage from the first rail voltage to the second rail voltage.

6. The apparatus of claim 1, wherein the compensation circuit is further configured to:

apply the first compensation voltage to the first node between the first and second switching devices during a first portion of a transition of the output voltage from the second rail voltage to the first rail voltage to maintain the first voltage across the second switching device at or below the first defined threshold during the first portion of the transition of the output voltage from the second rail voltage to the first rail voltage; and discontinue the application of the first compensation voltage to the first node between the first and second switching devices during a second portion of the transition of the output voltage from the second rail voltage to the first rail voltage.

7. The apparatus of claim 6, further comprising a controller configured to control the compensation circuit in applying the first compensation voltage to the first node between the first and second switching devices.

8. The apparatus of claim 7, wherein the controller is configured to turn on the second switching device during the first portion of the transition of the output voltage from the second rail voltage to the first rail voltage to form a first charging path from a source of the first compensation voltage to the output.

9. The apparatus of claim 8, wherein the controller is configured to turn on both the first and second switching devices during the second portion of the transition of the output voltage from the second rail voltage to the first rail voltage to form a second charging path from the first voltage rail to the output.

10. The apparatus of claim 7, wherein the controller is configured to turn off both the third and fourth switching devices during the transition of the output voltage from the second rail voltage to the first rail voltage.

11. The apparatus of claim 7, wherein the controller is configured to control the compensation circuit to apply the second compensation voltage to the second node between the third and fourth switching devices during the transition of the output voltage from the second rail voltage to the first rail voltage.

12. The apparatus of claim 1, wherein the compensation circuit is further configured to:

apply the second compensation voltage to the second node between the third and fourth switching devices during a first portion of a transition of the output voltage from the first rail voltage to the second rail voltage to maintain the second voltage across the third switching device at or below the second defined threshold during the first portion of the transition of the output voltage from the first rail voltage to the second rail voltage; and discontinue the application of the second compensation voltage to the second node between the third and fourth switching devices during a second portion of the transition of the output voltage from the first rail voltage to the second rail voltage.

13. The apparatus of claim 12, further comprising a controller configured to control the compensation circuit in applying the second compensation voltage to the second node between the third and fourth switching devices.

14. The apparatus of claim 13, wherein the controller is configured to turn on the third switching device during the first portion of the transition of the output voltage from the first rail voltage to the second rail voltage to form a first discharging path from the output to a source of the second compensation voltage.

15. The apparatus of claim 14, wherein the controller is configured to turn on both the third and fourth switching devices during the second portion of the transition of the output voltage from the first rail voltage to the second rail voltage to form a second discharging path from the output to the second voltage rail.

16. The apparatus of claim 13, wherein the controller is configured to turn off both the first and second switching devices during the transition of the output voltage from the first rail voltage to the second rail voltage.

17. The apparatus of claim 13, wherein the controller is configured to control the compensation circuit to apply the first compensation voltage to the first node between the first and second switching devices during the transition of the output voltage from the first rail voltage to the second rail voltage.

18. A method of generating an output voltage, comprising:

turning on first and second switching devices to couple a first voltage rail to an output to cause the output voltage to be substantially at a steady-state first rail voltage;

turning off third and fourth switching devices to isolate the output from a second voltage rail when the output voltage is at the steady-state first rail voltage;

turning on the third and fourth switching devices to couple the output to a second voltage rail to cause the output voltage to be substantially at a steady-state second rail voltage;

turning off the first and second switching devices to isolate the output from the first voltage rail when the output voltage is at the steady-state second rail voltage; and applying a first compensation voltage to a first node between the first and second switching devices to maintain a first voltage across the second switching device at or below a first defined threshold, the first defined threshold being substantially less than a difference between the first and second rail voltages;

applying a second compensation voltage to a second node between the third and fourth switching devices to maintain a second voltage across the third switching device at or below a second defined threshold, the second defined threshold being substantially less than the difference between the first and second rail voltages; or applying the first compensation voltage to the first node between the first and second switching devices to maintain the first voltage across the second switching device at or below the first defined threshold, and applying the second compensation voltage to the second node between the third and fourth switching devices to maintain the second voltage across the third switching device at or below the second defined threshold.

19. The method of claim 18, wherein applying the first compensation voltage to the first node between the first and second switching devices comprises applying the first compensation voltage to the first node between the first and second switching devices to maintain the first voltage across the second switching device at or below the first defined threshold when the output voltage is substantially at the steady-state second rail voltage.

20. The method of claim 18, wherein applying the second compensation voltage to the second node between the third and fourth switching devices comprises applying the second compensation voltage to the second node between the third and fourth switching devices to maintain the second voltage across the third switching device at or below the second defined threshold when the output voltage is substantially at the steady-state first rail voltage.

21. The method of claim 18, wherein applying the first compensation voltage to the first node between the first and second switching devices comprises applying the first compensation voltage to the first node between the first and second switching devices during at least a portion of a transition of the output voltage from the second rail voltage to the first rail voltage to maintain the first voltage across the second switching device at or below the first defined threshold during the transition of the output voltage from the second rail voltage to the first rail voltage.

22. The method of claim 18, wherein applying the second compensation voltage to the second node between the third and fourth switching devices comprises applying the second compensation voltage to the second node between the third and fourth switching devices during at least a portion of a transition of the output voltage from the first rail voltage to the second rail voltage to maintain the second voltage across the third switching device at or below the second defined threshold during the transition of the output voltage from the first rail voltage to the second rail voltage.

23. The method of claim 18, wherein applying the first compensation voltage to the first node between the first and second switching device comprises applying the first compensation voltage to the first node between the first and second switching devices during a first portion of a transition of the output voltage from the second rail voltage to the first rail voltage to maintain the first voltage across the second switching device at or below the first defined threshold during the first portion of the transition of the output voltage from the second rail voltage to the first rail voltage; and further comprising:

discontinue applying the first compensation voltage to the first node between the first and second switching devices during a second portion of the transition of the output voltage from the second rail voltage to the first rail voltage.

24. The method of claim 23, further comprising turning on the second switching device during the first portion of the transition of the output voltage from the second rail voltage to the first rail voltage to form a first charging path from a source of the first compensation voltage to the output.

25. The method of claim 24, further comprising turning on both the first and second switching devices during the second portion of the transition of the output voltage from the second rail voltage to the first rail voltage to form a second charging path from the first voltage rail to the output.

26. The method of claim 23, further comprising turning off both the third and fourth switching devices during the transition of the output voltage from the second rail voltage to the first rail voltage.

27. The method of claim 23, further comprising applying the second compensation voltage to the second node between the third and fourth switching devices during the transition of the output voltage from the second rail voltage to the first rail voltage.

28. The method of claim 18, wherein applying the second compensation voltage to the second node between the third and fourth switching devices comprises applying the second compensation voltage to the second node between the third and fourth switching devices during a first portion of a transition of the output voltage from the first rail voltage to the second rail voltage to maintain the second voltage across the third switching device at or below the second defined threshold during the first portion of the transition of the output voltage from the first rail voltage to the second rail voltage; and further comprising:

discontinue applying the second compensation voltage to the second node between the third and fourth switching devices during a second portion of the transition of the output voltage from the first rail voltage to the second rail voltage.

29. The method of claim 28, further comprising turning on the third switching device during the first portion of the transition of the output voltage from the first rail voltage to the second rail voltage to form a first discharging path from the output to a source of the second compensation voltage.

30. The method of claim 29, further comprising turning on both the third and fourth switching devices during the second portion of the transition of the output voltage from the first rail voltage to the second rail voltage to form a second discharging path from the output to the second voltage rail.

31. The method of claim 27, further comprising turning off both the first and second switching devices during the transition of the output voltage from the first rail voltage to the second rail voltage.

32. The method of claim 27, further comprising applying the first compensation voltage to the first node between the first and second switching devices during the transition of the output voltage from the first rail voltage to the second rail voltage.

33. An apparatus, comprising:

first and second switching means for coupling a first voltage rail to an output to cause a voltage at the output to be substantially at a steady-state first rail voltage, and for isolating the output from the first voltage rail when the output voltage is substantially at a steady-state second rail voltage;

third and fourth switching means for coupling the output to a second voltage rail to cause the output voltage to be substantially at the steady-state second rail voltage, and for isolating the output from the second voltage rail when the output voltage is substantially at the steady-state first rail voltage; and first coupling means for coupling a first compensation voltage to a first node between the first and second switching means to maintain a first voltage across the second switching means at or below a first defined threshold, the first defined threshold being substantially less than a difference between the first and second rail voltages;

second coupling means for coupling a second compensation voltage to a second node between the third and fourth switching means to maintain a second voltage across the third switching means at or below a second defined threshold, the second defined threshold being substantially less than the difference between the first and second rail voltages; or the first coupling means for coupling the first compensation voltage to the first node between the first and second switching means to maintain the first voltage across the second switching means at or below the first defined threshold, and the second coupling means for coupling the second compensation voltage to the second node between the third and fourth switching means to maintain the second voltage across the third switching means at or below the second defined threshold.

34. The apparatus of claim 33, wherein the first coupling means is configured to couple the first compensation voltage to the first node between the first and second switching means to maintain the first voltage across the second switching means at or below the first defined threshold when the output voltage is substantially at the steady-state second rail voltage.

35. The apparatus of claim 33, wherein the second coupling means is configured to couple the second compensation voltage to the second node between the third and fourth switching means to maintain the second voltage across the third switching means at or below the second defined threshold when the output voltage is substantially at the steady-state first rail voltage.

36. The apparatus of claim 33, wherein the first coupling means is configured to couple the first compensation voltage to the first node between the first and second switching means during at least a portion of a transition of the output voltage from the second rail voltage to the first rail voltage to maintain the first voltage across the second switching means at or below the first defined threshold during the transition of the output voltage from the second rail voltage to the first rail voltage.

37. The apparatus of claim 33, wherein the second coupling means is configured to couple the second compensation voltage to the second node between the third and fourth switching means during at least a portion of a transition of the output voltage from the first rail voltage to the second rail voltage to maintain the second voltage across the third switching means at or below the second defined threshold during the transition of the output voltage from the first rail voltage to the second rail voltage.

38. The apparatus of claim 33, wherein the first coupling means is configured to:

couple the first compensation voltage to the first node between the first and second switching means during a first portion of a transition of the output voltage from the second rail voltage to the first rail voltage to maintain the first voltage across the second switching means at or below the first defined threshold during the first portion of the transition of the output voltage from the second rail voltage to the first rail voltage; and decouple the first compensation voltage from the first node between the first and second switching devices during a second portion of the transition of the output voltage from the second rail voltage to the first rail voltage.

39. The apparatus of claim 38, further comprising means for controlling the first, second, third, and fourth switching means, and the first and second coupling means.

40. The apparatus of claim 39, wherein the controlling means is configured to turn on the second switching means during the first portion of the transition of the output voltage from the second rail voltage to the first rail voltage to form a first charging path from a means for generating of the first compensation voltage to the output.

41. The apparatus of claim 40, wherein the controlling means is configured to turn on both the first and second switching means during the second portion of the transition of the output voltage from the second rail voltage to the first rail voltage to form a second charging path from the first voltage rail to the output.

42. The apparatus of claim 38, wherein the controlling means is configured to turn off both the third and fourth switching means during the transition of the output voltage from the second rail voltage to the first rail voltage.

43. The apparatus of claim 38, wherein the controlling means is configured to cause the second coupling means to couple the second compensation voltage to the second node between the third and fourth switching devices during the transition of the output voltage from the second rail voltage to the first rail voltage.

44. The apparatus of claim 33, wherein the second coupling means is configured to:

couple the second compensation voltage to the second node between the third and fourth switching means during a first portion of a transition of the output voltage from the first rail voltage to the second rail voltage to maintain the second voltage across the third switching means at or below the second defined threshold during the first portion of the transition of the output voltage from the first rail voltage to the second rail voltage; and decouple the second compensation voltage from the second node between the third and fourth switching means during a second portion of the transition of the output voltage from the first rail voltage to the second rail voltage.

45. The apparatus of claim 44, further comprising means for controlling the first, second, third, and fourth switching means, and the first and second coupling means.

46. The apparatus of claim 45, wherein the controlling means is configured to turn on the third switching means during the first portion of the transition of the output voltage from the first rail voltage to the second rail voltage to form a first discharging path from the output to a means for generating the second compensation voltage.

47. The apparatus of claim 46, wherein the controlling means is configured to turn on both the third and fourth switching means during the second portion of the transition of the output voltage from the first rail voltage to the second rail voltage to form a second discharging path from the output to the second voltage rail.

48. The apparatus of claim 44, wherein the controlling means is configured to turn off both the first and second switching means during the transition of the output voltage from the first rail voltage to the second rail voltage.

49. The apparatus of claim 44, wherein the controlling means is configured to control the first coupling means to couple the first compensation voltage to the first node between the first and second switching devices during the transition of the output voltage from the first rail voltage to the second rail voltage.

* * * * *